(12) United States Patent
Ou et al.

(10) Patent No.: US 11,362,660 B2
(45) Date of Patent: *Jun. 14, 2022

(54) LEVEL SHIFTER CIRCUIT AND METHOD OF OPERATING THE SAME

(71) Applicant: TAIWAN SEMICONDUCTOR MANUFACTURING COMPANY, LTD., Hsinchu (TW)

(72) Inventors: Yu-Lun Ou, Hsinchu (TW); Ji-Yung Lin, Hsinchu (TW); Yung-Chen Chien, Hsinchu (TW); Ruei-Wun Sun, Hsinchu (TW); Wei-Hsiang Ma, Hsinchu (TW); Jerry Chang Jui Kao, Hsinchu (TW); Shang-Chih Hsieh, Hsinchu (TW); Lee-Chung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/321,808

(22) Filed: May 17, 2021

(65) Prior Publication Data
US 2021/0273640 A1    Sep. 2, 2021

Related U.S. Application Data

(63) Continuation of application No. 16/936,281, filed on Jul. 22, 2020, now Pat. No. 11,012,073, which is a
(Continued)

(51) Int. Cl.
*H03K 3/037* (2006.01)
*H03K 19/0185* (2006.01)

(52) U.S. Cl.
CPC ..... *H03K 19/018521* (2013.01); *H03K 3/037* (2013.01)

(58) Field of Classification Search
CPC ............. H03K 3/037; H03K 19/0175; H03K 19/017509; H03K 19/0185; H03K 19/018507; H03K 19/018521
(Continued)

(56) References Cited

U.S. PATENT DOCUMENTS 5,781,026 A     7/1998   Chow
7,295,038 B2   11/2007   Seo
(Continued)

OTHER PUBLICATIONS

Office Action dated Jun. 15, 2021 for corresponding case No. TW 11020562490. (pp. 1-6).

*Primary Examiner* — William Hernandez
(74) *Attorney, Agent, or Firm* — Hauptman Ham, LLP

(57) ABSTRACT

A circuit includes a level shifter circuit, an output circuit, an enable circuit, a first and a second feedback circuit. The level shifter circuit is coupled to a first voltage supply, and is configured to generate at least a first and a second signal responsive to at least the first enable signal or the first input signal. The output circuit is coupled to at least the level shifter circuit and the first voltage supply, and configured to receive the first and the second signal. The enable circuit is configured to generate a second enable signal responsive to the first enable signal. The first feedback circuit is configured to receive the first enable signal, the second enable signal and the first feedback signal. The second feedback circuit is configured to receive the first enable signal, the second enable signal and the second feedback signal.

20 Claims, 12 Drawing Sheets

Related U.S. Application Data continuation of application No. 16/365,222, filed on Mar. 26, 2019, now Pat. No. 10,735,001.

(60) Provisional application No. 62/657,645, filed on Apr. 13, 2018.

(58) Field of Classification Search
USPC .................................... 326/80, 81; 327/333
See application file for complete search history.

(56) References Cited

U.S. PATENT DOCUMENTS

| | | |
|---|---|---|
| 10,432,199 B1 | 10/2019 | Zhang |
| 11,050,424 B1 * | 6/2021 | Nagarajan .............. H03K 3/037 |
| 2006/0061386 A1 | 3/2006 | Kanzaki |
| 2008/0204078 A1 | 8/2008 | O |
| 2011/0156753 A1 | 6/2011 | Zhang |
| 2014/0035672 A1 | 2/2014 | Ahmad |
| 2015/0207506 A1 | 7/2015 | Song |
| 2019/0305760 A1 | 10/2019 | Shin |

* cited by examiner

LEVEL SHIFTER CIRCUIT AND METHOD OF OPERATING THE SAME

PRIORITY CLAIM

The present application is a continuation of U.S. application Ser. No. 16/936,281, filed Jul. 22, 2020, now U.S. Pat. No. 11,012,073, issued May 18, 2021, which is a continuation of U.S. application Ser. No. 16/365,222, filed Mar. 26, 2019, now U.S. Pat. No. 10,735,001, issued Aug. 4, 2020, which claims the benefit of U.S. Provisional Application No. 62/657,645, filed Apr. 13, 2018, the disclosures of which are incorporated herein by reference in their entireties.

BACKGROUND

The semiconductor integrated circuit (IC) industry has produced a wide variety of digital devices to address issues in a number of different areas. Some of these digital devices, such as level shifter circuits, are configured to enable operation of circuits capable of operation in different voltage domains. As ICs have become smaller and more complex, operating voltages of these digital devices continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
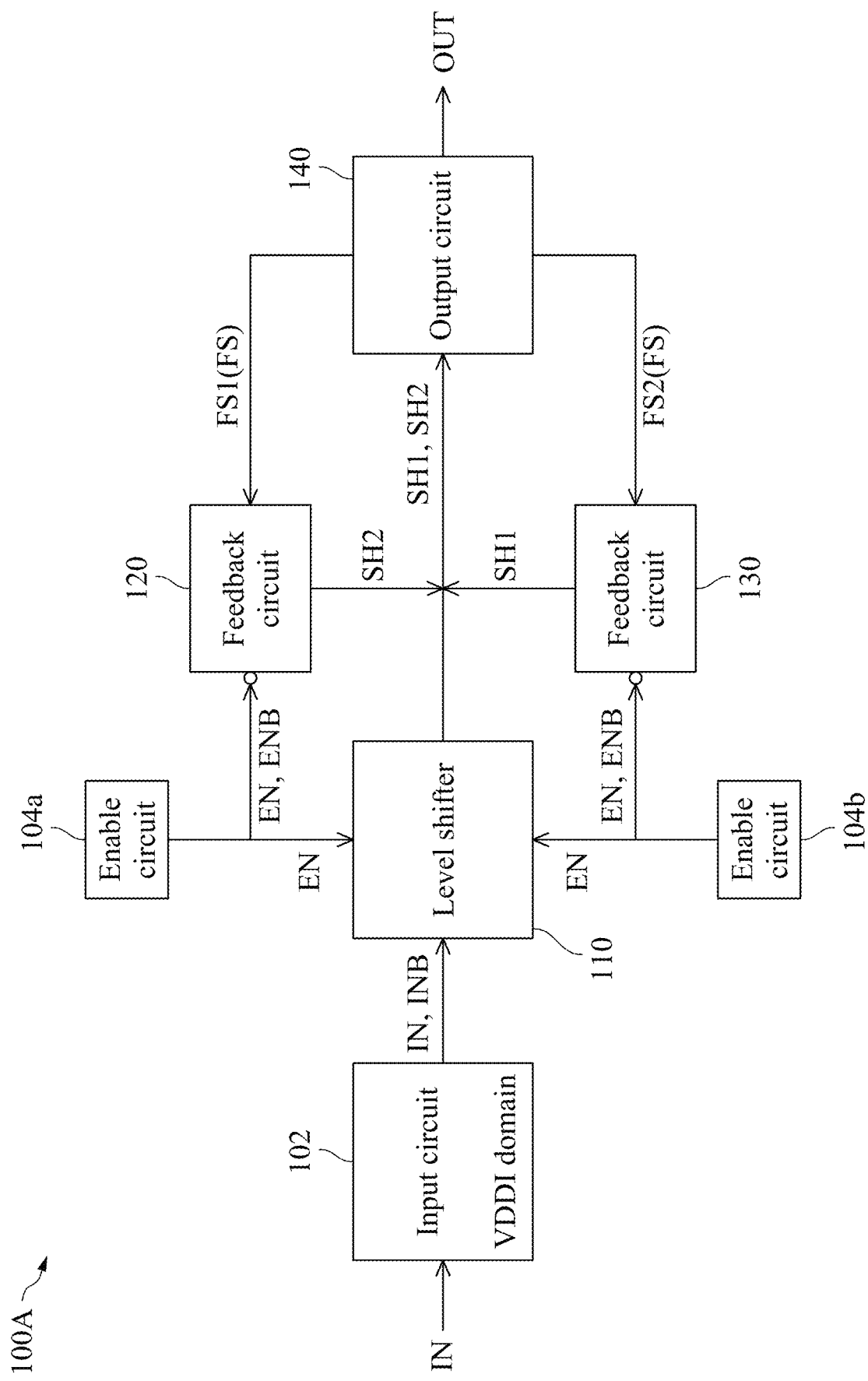
FIG. 1A is a block diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a circuit includes a level shifter circuit, a feedback circuit and an output circuit. The level shifter circuit is configured to receive an enable signal and a first input signal having a first voltage swing. The level shifter circuit is further configured to generate a first signal and a second signal responsive to at least the enable signal or the first input signal. In some embodiments, the first signal or the second signal has a second voltage swing different from the first voltage swing.

In some embodiments, the feedback circuit is coupled to the level shifter circuit, and configured to latch a previous state of the first signal responsive to at least the first signal or the second signal. The feedback circuit is controlled by a set of feedback signals. The feedback circuit includes a first path and a second path. In some embodiments, the first path and the second path are enabled or disabled by at least the set of feedback signals or the first enable signal.

The output circuit is coupled to the level shifter circuit and the feedback circuit, and configured to generate an output signal based on at least the first signal. In some embodiments, the output circuit is configured to latch a previous state of the output signal responsive to at least the first signal or the second signal. In some embodiments, the output circuit is configured to generate at least the output signal or the set of feedback signals responsive to the first signal.

In some embodiments, the level shifter includes a first path and a second path. In some embodiments, the first path includes a first transistor, and the second path includes a second transistor. In some embodiments, by including the first transistor in the first path of the level shifter circuit, and by including the second transistor in the second path of the level shifter circuit, short circuit currents in the first path and the second path of the level shifter circuit are prevented when the level shifter circuit of the present disclosure is disabled by the enable signal resulting in lower power consumption than other approaches with short circuit currents.

Integrated Circuit

FIG. 1A is a block diagram of an integrated circuit 100A, in accordance with some embodiments.

Integrated circuit 100A comprises an input circuit 102, an enable circuit 104a, an enable circuit 104b, a level shifter circuit 110, a feedback circuit 120, a feedback circuit 130, and an output circuit 140.

Input circuit 102 is coupled to level shifter circuit 110. Input circuit 102 is configured to receive an input signal IN, and to generate at least an input signal INB. Input signal INB is inverted from input signal IN. In some embodiments, input circuit 102 is configured to generate input signal INB and an input signal INBB (shown in FIG. 4). Input signal INBB is inverted from input signal INB. In some embodiments, input circuit 102 is configured to output one or more of input signal IN, input signal INB or input signal INBB to level shifter circuit 110.

In some embodiments, input circuit 102 is coupled to a first voltage supply node 1N. In some embodiments, first voltage supply node 1N has a first supply voltage VDDI (FIGS. 2-9), and is therefore referred to as being in a VDDI voltage domain. In some embodiments, first supply voltage VDDI has a first voltage swing. In some embodiments, one or more of input signal IN, input signal INB or input signal INBB have the first voltage swing.

Enable circuit 104a is coupled to a first input terminal of level shifter circuit 110 and an input terminal of feedback circuit 120. Enable circuit 104a is configured to receive an enable signal EN, and to generate an inverted enable signal ENB. Inverted enable signal ENB is inverted from enable signal EN. In some embodiments, enable circuit 104a is configured to output at least enable signal EN or inverted enable signal ENB to level shifter circuit 110. In some embodiments, enable circuit 104a is configured to output at least enable signal EN or inverted enable signal ENB to feedback circuit 120.

Enable circuit 104b is coupled to a second input terminal of level shifter circuit 110 and an input terminal of feedback circuit 130. Enable circuit 104b is configured to receive enable signal EN, and to generate inverted enable signal ENB. In some embodiments, enable circuit 104b is configured to output at least enable signal EN or inverted enable signal ENB to level shifter circuit 110. In some embodiments, enable circuit 104b is configured to output at least enable signal EN or inverted enable signal ENB to feedback circuit 130. In some embodiments, enable circuit 104b and enable circuit 104a are part of a same enable circuit 204 (as shown in FIGS. 2-9). In some embodiments, enable circuit 104b and enable circuit 104a are different enable circuits.

Figure 1B:
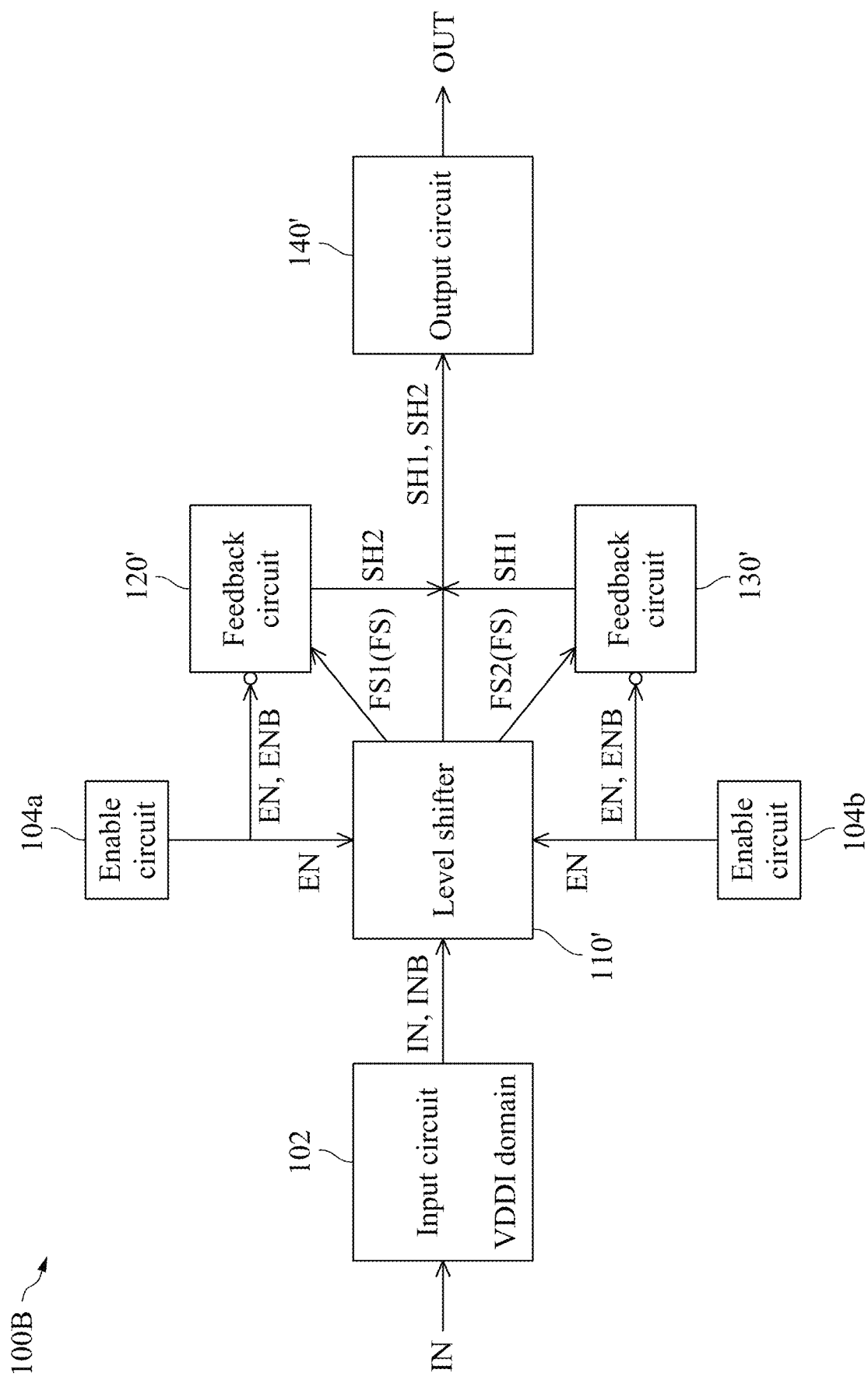
FIG. 1B is a block diagram of an integrated circuit, in accordance with some embodiments.

Level shifter circuit 110 is coupled to input circuit 102, enable circuit 104a, enable circuit 104b and output circuit 140. In some embodiments, level shifter circuit 110 is further coupled to feedback circuit 120 and feedback circuit 130 (FIG. 1B). Level shifter circuit 110 is configured to receive at least enable signal EN, input signal IN or input signal INB. In some embodiments, level shifter circuit 110 is configured to receive at least enable signal EN, inverted enable signal ENB, input signal IN, input signal INB or input signal INBB. In some embodiments, level shifter circuit 110 is configured to generate at least a first signal SH1 or a second signal SH2 responsive to at least enable signal EN, inverted enable signal ENB, input signal IN, input signal INB or input signal INBB. Level shifter circuit 110 is configured to output at least first signal SH1 or second signal SH2 to output circuit 140. In other words, one or more of first signal SH1 or second signal SH2 is the output of level shifter circuit 110.

In some embodiments, level shifter circuit 110 is coupled to a second voltage supply node 2N having a second supply voltage VDDO (FIGS. 2-9), and is therefore referred to as being in a VDDO voltage domain. In some embodiments, second supply voltage VDDO is different from first supply voltage VDDI. In some embodiments, second supply voltage VDDO has a second voltage swing different from the first voltage swing. In some embodiments, VDDO voltage domain is different from VDDI voltage domain. Level shifter circuit 110 is a level shifter circuit configured to shift input signals IN, INB, or INBB from the VDDI voltage domain that uses a first supply voltage VDDI to the VDDO voltage domain that uses a second supply voltage VDDO.

In some embodiments, one or more of first signal SH1 or second signal SH2 are referred to as level shifted output signals. In some embodiments, one or more of first signal SH1 or second signal SH2 has the second voltage swing.

Output circuit 140 is coupled to level shifter circuit 110 and feedback circuits 120 and 130. An input terminal of output circuit 140 is coupled to at least an output terminal of level shifter circuit 110 or an output terminal of corresponding feedback circuits 120 and 130, and configured to receive at least first signal SH1 or second signal SH2. Output circuit 140 is configured to generate at least an output signal OUT or feedback signals FS1, FS2 (collectively referred to as a "set of feedback signals FS") responsive to at least first signal SH1 or second signal SH2.

A first output terminal of output circuit 140 is configured to output the output signal OUT. In some embodiments, a second output terminal of output circuit 140 is configured to output the feedback signal FS1 to feedback circuit 120, and a third output terminal of output circuit 140 is configured to output the feedback signal FS2 to feedback circuit 130. Output signal OUT is the output signal of integrated circuit 100A or 100B (FIG. 1B). Feedback signals FS1, FS2 are configured to control corresponding feedback circuits 120, 130.

In some embodiments, output signal OUT is referred to as a level shifted output signal of integrated circuits 100A-100B. In some embodiments, one or more of output signal OUT or set of feedback signals FS has the second voltage swing. In some embodiments, output signal OUT is a level shifted version of input signal IN. In some embodiments, output circuit 140 is configured to latch or maintain a previous state of the output signal OUT in response to at least enable signal EN or inverted enable signal ENB. In some embodiments, output signal OUT is a latched or previous state of the output signal OUT or a level shifted version of input signal IN.

Feedback circuit 120 is coupled to enable circuit 104a and output circuit 140. In some embodiments, feedback circuit 120 is further coupled to level shifter circuit 110 (FIGS. 1B-9). Feedback circuit 120 is configured to receive at least enable signal EN or inverted enable signal ENB from enable circuit 104a. Feedback circuit 120 is configured to receive feedback signal FS1 from output circuit 140. In some embodiments, feedback circuit 120 is configured to output second signal SH2 to output circuit 140. In some embodiments, feedback circuit 120 is configured to adjust the second signal SH2 in response to at least feedback signal FS1, enable signal EN or inverted enable signal ENB. In some embodiments, feedback circuit 120 is configured to latch or maintain a previous state of the second signal SH2 in response to at least feedback signal FS1, enable signal EN or inverted enable signal ENB.

Feedback circuit 130 is coupled to enable circuit 104b and output circuit 140. In some embodiments, feedback circuit 130 is further coupled to level shifter circuit 110 (FIGS. 1B-9). Feedback circuit 130 is configured to receive at least enable signal EN or inverted enable signal ENB from enable circuit 104b. Feedback circuit 130 is configured to receive feedback signal FS2 from output circuit 140. In some embodiments, feedback circuit 130 is configured to output first signal SH1 to output circuit 140. In some embodiments, feedback circuit 130 is configured to adjust the first signal SH1 in response to at least feedback signal FS2, enable signal EN or inverted enable signal ENB. In some embodiments, feedback circuit 130 is configured to latch or maintain a previous state of the first signal SH1 in response to at least feedback signal FS2, enable signal EN or inverted enable signal ENB. In some embodiments, at least feedback circuit 120, feedback circuit 130 or output circuit 140 is coupled to the second voltage supply node 2N (FIGS. 2-9).

Integrated circuit 100A or 100B is configured to operate in a first mode or a second mode. For example, in the first mode, the output signal OUT corresponds to a level shifted version of the input signal IN. In the second mode, the output signal OUT is a previous state or latched state of the output signal OUT. In some embodiments, the first mode is referred to as a level shifting mode, and the second mode is referred to as a latch mode. In some embodiments, integrated circuit 100A or 100B is referred to as a level shifter with a memory element.

Level shifter circuit 110 and at least feedback circuit 120 or 130 are also configured to operate in the first mode or the second mode in a complementary manner.

For example, in the first mode, level shifter circuit 110 is enabled, and feedback circuits 120 and 130 are disabled, and the output signal OUT corresponds to a level shifted version of the input signal IN.

Similarly, in the second mode, level shifter circuit 110 is disabled, and feedback circuits 120 and 130 are enabled, and the output circuit 140 or feedback circuits 120 and 130 are configured to latch the previous state of the output signal OUT. In the second mode, the output signal OUT is a previous state or latched state of the output signal OUT.

In some embodiments, level shifter circuit 110 is enabled or turned on by enable signal EN having a first logical value, and feedback circuits 120 and 130 are disabled or turned off by enable signal EN having the first logical value.

In some embodiments, level shifter circuit 110 is disabled or turned off by enable signal EN having a second logical value, and feedback circuits 120 and 130 are enabled or turned on by enable signal EN having the second logical value. In some embodiments, the second logical value is inverted from the first logical value.

In some embodiments, by disabling the level shifter circuit 110 and enabling the feedback circuits 120 and 130, integrated circuit 100A-100B has better power performance than other approaches. In some embodiments, by disabling the level shifter circuit 110 and enabling the feedback circuits 120 and 130, integrated circuit 100A-100B consumes less power than other approaches.

FIG. 1B is a block diagram of an integrated circuit 100B, in accordance with some embodiments. Integrated circuit 100B is a variation of integrated circuit 100A, and similar detailed description is therefore omitted. For example, integrated circuit 100B illustrates an example of where the set of feedback signals FS are generated by the level shifter circuit 110'.

Components that are the same or similar to those in one or more of FIGS. 1A-1B and 2-9 (shown below) are given the same reference numbers, and detailed description thereof is thus omitted.

In comparison with integrated circuit 100A of FIG. 1A, level shifter circuit 110' replaces level shifter circuit 110, feedback circuit 120' replaces feedback circuit 120, feedback circuit 130' replaces feedback circuit 130 and output circuit 140' replaces output circuit 140, and similar detailed description is therefore omitted.

In comparison with some embodiments of FIG. 1A, output circuit 140' does not generate the set of feedback signals FS, and level shifter circuit 110' generates the set of feedback signals FS. Level shifter circuit 110' is coupled to input circuit 102, enable circuits 104a and 104b, feedback circuits 120' and 130' and output circuit 140'. Level shifter circuit 110' outputs feedback signal FS1 to feedback circuit 120', and outputs feedback signal FS2 to feedback circuit 130'. In some embodiments, first signal SH1 of FIG. 1B is a same signal as feedback signal FS1, and second signal SH2 of FIG. 1B is a same signal as feedback signal FS2.

In some embodiments, feedback circuit 120' is configured to maintain or set a state of the second signal SH2 in response to at least feedback signal FS1, first signal SH1, enable signal EN or inverted enable signal ENB.

In some embodiments, feedback circuit 130' is configured to maintain or set a state of the first signal SH1 in response to at least feedback signal FS2, second signal SH2, enable signal EN or inverted enable signal ENB.

In comparison with some embodiments of FIG. 1A, output circuit 140' does not latch the output signal OUT. In some embodiments, feedback circuits 120' and 130' are configured to latch or maintain a previous state of the output signal OUT in response to at least the set of feedback signals FS, first signal SH1, second signal SH2, enable signal EN or inverted enable signal ENB.

Figure 2:
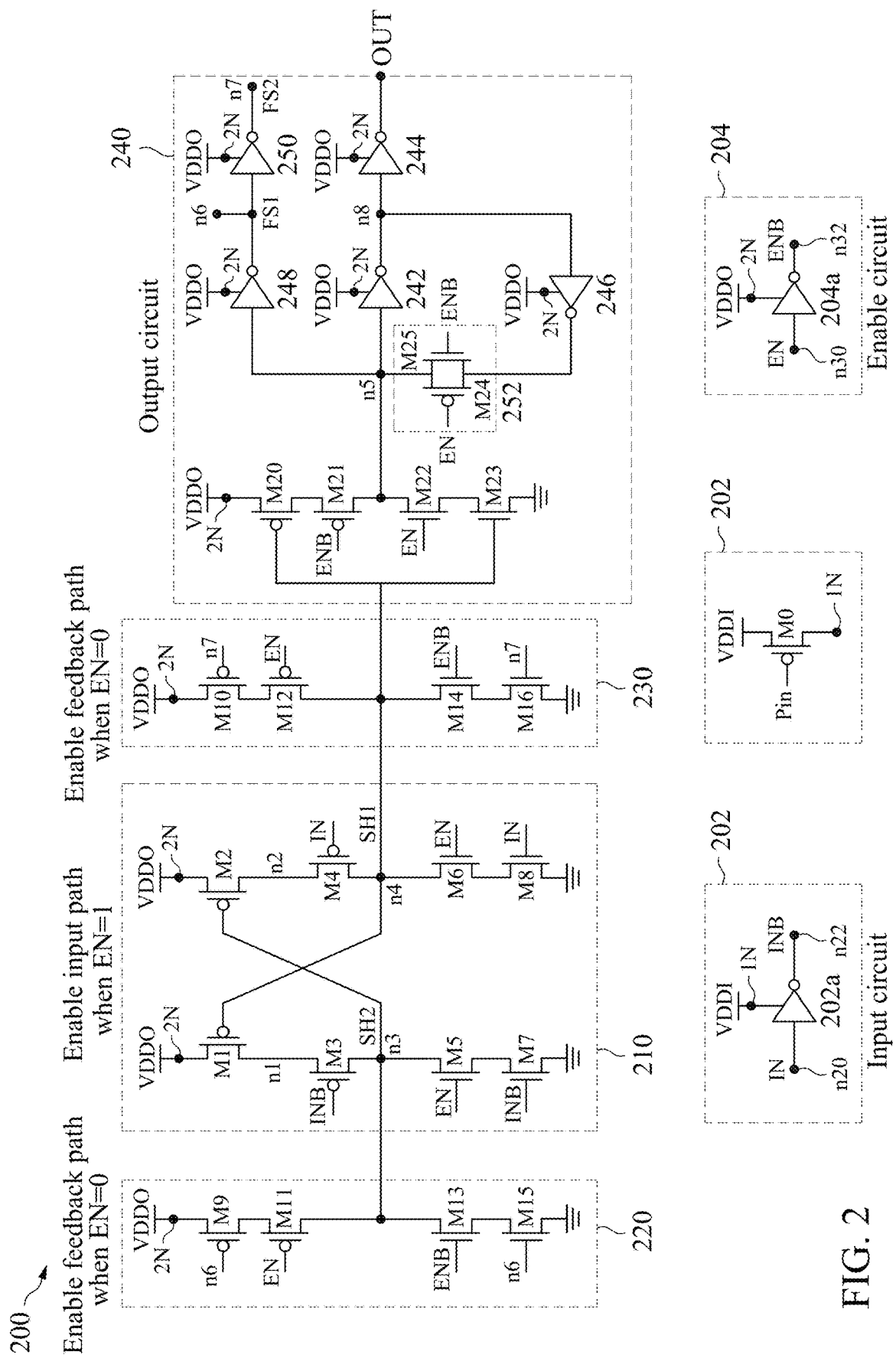
FIG. 2 is a circuit diagram of a circuit, in accordance with some embodiments.

FIG. 2 is a circuit diagram of a circuit 200, in accordance with some embodiments.

Circuit 200 is an embodiment of integrated circuit 100A of FIG. 1A.

Circuit 200 comprises an input circuit 202, an enable circuit 204, a level shifter circuit 210, a feedback circuit 220, a feedback circuit 230, and an output circuit 240.

Input circuit 202 is an embodiment of input circuit 102 of FIG. 1A, and similar detailed description is omitted. Input circuit 202 comprises an inverter 202a coupled to a P-type Metal Oxide Semiconductor (PMOS) transistor m0. For ease of illustration, inverter 202a and PMOS transistor m0 are not shown as being coupled to each other. Inverter 202a is coupled to the first voltage supply node IN. The first voltage supply node IN is coupled to the PMOS transistor m0. Inverter 202a and PMOS transistor m0 are configured to operate in the VDDI voltage domain. Inverter 202a is configured to generate an input signal INB in response to input signal IN. An input terminal (e.g., node n20) of inverter 202a is configured to receive an input signal IN. An output terminal (e.g., node n22) of inverter 202a is configured to output input signal INB. Input circuit 202 and inverter 202a are coupled to level shifter circuit 210. For ease of illustration, input circuit 202 and inverter 202a are not shown as being coupled to level shifter circuit 210.

PMOS transistor m0 is configured to provide a supply voltage VDDI to the first voltage supply node 1N and inverter 202a. PMOS transistor m0 is configured to receive a power enable signal Pin. A gate terminal of PMOS transistor m0 is configured to receive the power enable signal Pin. PMOS transistor m0 is turned on or off based on the power enable signal Pin. A drain terminal of PMOS transistor m0 is configured to receive the supply voltage VDDI from a node (not labelled). A source terminal of PMOS transistor m0 is coupled with the first voltage supply node IN and inverter 202a. In some embodiments, turning on the input power to circuit 200 comprises turning on PMOS transistor m0 responsive to power enable signal Pin, such that PMOS transistor m0 provides supply voltage VDDI to the first voltage supply node IN and inverter 202a. In some embodiments, turning off the input power to circuit 200 comprises turning off PMOS transistor m0 responsive to power enable signal Pin, such that PMOS transistor m0 does not provide supply voltage VDDI to the first voltage supply node IN and inverter 202a. Other transistor types in input circuit 202 are within the scope of the present disclosure.

Enable circuit 204 is an embodiment of at least enable circuit 104a or 104b of FIG. 1A, and similar detailed description is omitted. Enable circuit 204 comprises an inverter 204a coupled to the second voltage supply node 2N. Enable circuit 204 and inverter 204a are coupled to level shifter circuit 210, feedback circuit 220, feedback circuit 230 and output circuit 240. For ease of illustration, enable circuit 204 and inverter 204a are not shown as being coupled to level shifter circuit 210, feedback circuit 220, feedback circuit 230 and output circuit 240.

Inverter 204a is configured to operate in the VDDO voltage domain. Inverter 204a is configured to generate inverted enable signal ENB in response to enable signal EN. An input terminal n30 of inverter 204a is configured to receive enable signal EN. In some embodiments, input terminal n30 of inverter 204a is coupled to level shifter circuit 210, feedback circuit 220, feedback circuit 230 and output circuit 240. An output terminal n32 of inverter 204a is configured to output inverted enable signal ENB to feedback circuits 220 and 230 and output circuit 240. Output terminal n32 of inverter 204a is coupled to feedback circuits 220 and 230 and output circuit 240.

Level shifter circuit 210 is an embodiment of level shifter circuit 110 of FIG. 1A, and similar detailed description is omitted. Level shifter circuit 210 is configured to shift input signals IN or INB from the VDDI voltage domain to the VDDO voltage domain. Level shifter circuit 210 is coupled to at least input circuit 202, enable circuit 204, feedback circuit 220, feedback circuit 230, and output circuit 240. Level shifter 210 is configured to receive at least enable signal EN, input signal IN or input signal INB. Level shifter 210 is configured to generate first signal SH1 responsive to at least enable signal EN or input signal IN. Level shifter 210 is configured to generate second signal SH2 responsive to at least enable signal EN or input signal INB. First signal SH1 or second signal SH2 is the output of level shifter circuit 210. Level shifter circuit 210 is configured to operate in the VDDO voltage domain. In some embodiments, one or more of first signal SH1 or second signal SH2 is the level shifted output signal (e.g., second voltage swing) of input signal IN (e.g., first voltage swing).

Level shifter circuit 210 comprises P-type Metal Oxide Semiconductor (PMOS) transistors m1, m2, m3 and m4 and N-type Metal Oxide Semiconductor (NMOS) transistors m5, m6, m7 and m8. Each of PMOS transistors m1, m2, m3, and m4 and NMOS transistors m5, m6, m7 and m8 is configured to operate in the VDDO voltage domain.

PMOS transistors m1 and m3 (collectively referred to as "a first set of transistors") are coupled between a first node n3 of level shifter circuit 210 and the second voltage supply node 2N. A voltage of the first node n3 corresponds to a voltage of second signal SH2.

PMOS transistors m2 and m4 (collectively referred to as "a second set of transistors") are coupled between a second node n4 of level shifter circuit 210 and the second voltage supply node 2N. A voltage of the second node n4 corresponds to a voltage of first signal SH1.

A gate terminal of PMOS transistor m1 is coupled to at least the second node n4 and configured to receive the first signal SH1. PMOS transistor m1 is turned on or off based on first signal SH1. A source terminal of PMOS transistor m1 is coupled with second voltage supply node 2N.

A gate terminal of PMOS transistor m2 is coupled to at least the first node n3 and configured to receive the second signal SH2. PMOS transistor m2 is turned on or off based on second signal SH2. A source terminal of PMOS transistor m2 is coupled with second voltage supply node 2N.

A gate terminal of PMOS transistor m3 is coupled to at least node n22 and configured to receive the input signal INB. PMOS transistor m3 is turned on or off based on input signal INB. A drain terminal of PMOS transistor m3 is coupled with at least the first node n3. A drain terminal of PMOS transistor m1 and a source terminal of PMOS transistor m3 are coupled to each other at a node n1.

A gate terminal of PMOS transistor m4 is coupled to at least node n20 and configured to receive the input signal IN. PMOS transistor m4 is turned on or off based on input signal IN. A drain terminal of PMOS transistor m4 is coupled with at least the second node n4. A drain terminal of PMOS transistor m2 and a source terminal of PMOS transistor m4 are coupled to each other at a node n2.

NMOS transistor m7 (collectively referred to as "a third set of transistors") and NMOS transistor m8 (collectively referred to as "a fourth set of transistors") are each coupled to a reference supply node VSS.

A gate terminal of NMOS transistor m7 is coupled to at least node n22 and configured to receive input signal INB. NMOS transistor m7 is turned on or off based on input signal INB. A source terminal of NMOS transistor m7 is coupled with at least the reference supply node VSS.

A gate terminal of NMOS transistor m8 is coupled to at least node n20 and configured to receive input signal IN. NMOS transistor m8 is turned on or off based on input signal IN. A source terminal of NMOS transistor m8 is coupled with at least the reference supply node VSS.

NMOS transistor m5 (collectively referred to as "a fifth set of transistors") is coupled between NMOS transistor m7 and the first node n3.

A gate terminal of NMOS transistor m5 is coupled to at least node n30 and configured to receive enable signal EN. NMOS transistor m5 is turned on or off based on enable signal EN. A drain terminal of NMOS transistor m5 and the drain terminal of PMOS transistor m3 are coupled to each other at first node n3. A source terminal of NMOS transistor m5 and a drain terminal of NMOS transistor m7 are coupled to each other.

NMOS transistor m6 (collectively referred to as "a sixth set of transistors") is coupled between NMOS transistor m8 and the second node n4.

A gate terminal of NMOS transistor m6 is coupled to at least node n30 and configured to receive enable signal EN. NMOS transistor m6 is turned on or off based on enable signal EN. A drain terminal of NMOS transistor m6 and the drain terminal of PMOS transistor m4 are coupled to each other at second node n4. A source terminal of NMOS transistor m6 and a drain terminal of NMOS transistor m8 are coupled to each other.

NMOS transistor m5, NMOS transistor m7, PMOS transistor m1 and PMOS transistor m3 are referred to as a first input path of level shifter circuit 210. NMOS transistor m6, NMOS transistor m8, PMOS transistor m2 and PMOS transistor m4 are referred to as a second input path of level shifter circuit 210. The first input path and the second input path of level shifter circuit 210 are enabled or disabled by enable signal EN.

Feedback circuit 220 is an embodiment of feedback circuit 120 of FIG. 1A, and similar detailed description is omitted. Feedback circuit 220 is configured to receive enable signal EN, inverted enable signal ENB and feedback signal FS1. Feedback circuit 220 is coupled to at least the second voltage supply node 2N or the second first node n3 of level shifter circuit 210. Feedback circuit 220 comprises PMOS transistors m9 and m11 and NMOS transistors m13 and m15. Each of PMOS transistors m9 and m11 and NMOS transistors m13 and m15 is configured to operate in the VDDO voltage domain.

A gate terminal of PMOS transistor m9 is coupled to at least a node n6 of output circuit 240 and configured to receive the feedback signal FS1. PMOS transistor m9 is turned on or off based on feedback signal FS1. A source terminal of PMOS transistor m9 is coupled with second voltage supply node 2N. A drain terminal of PMOS transistor m9 is coupled with a source terminal of PMOS transistor m11.

A gate terminal of PMOS transistor m11 is coupled to at least node n30 and configured to receive enable signal EN. PMOS transistor m11 is turned on or off based on enable signal EN. A drain terminal of PMOS transistor m11 is coupled with at least the first node n3.

A gate terminal of NMOS transistor m13 is coupled to at least node n32 and configured to receive inverted enable signal ENB. NMOS transistor m13 is turned on or off based on inverted enable signal ENB. A drain terminal of NMOS transistor m13 and the drain terminal of PMOS transistor m11 are coupled to each other at first node n3. A source terminal of NMOS transistor m13 and a drain terminal of NMOS transistor m15 are coupled to each other.

A gate terminal of NMOS transistor m15 is coupled to at least node n6 of output circuit 240 and configured to receive feedback signal FS1. In some embodiments, each of the gate terminal of NMOS transistor m15, node n6 of output circuit 240 and the gate terminal of PMOS transistor m9 are coupled together. NMOS transistor m15 is turned on or off based on feedback signal FS1. A source terminal of NMOS transistor m15 is coupled with at least the reference supply node VSS.

Each of the drain terminal of NMOS transistor m13, the drain terminal of PMOS transistor m11, the drain terminal of NMOS transistor m5, the drain terminal of PMOS transistor m3 and the gate terminal of PMOS transistor m2 are coupled to each other at first node n3.

NMOS transistor m13, NMOS transistor m15, PMOS transistor m9 and PMOS transistor m11 are referred to as a first feedback path of feedback circuit 220.

Feedback circuit 220 or level shifter circuit 210 is configured to set the voltage of first node n3 which corresponds to second signal SH2. NMOS transistors m13 and m15 and PMOS transistors m9 and m11 of feedback circuit 220 or NMOS transistors m5 and m7 and PMOS transistors m1 and m3 of level shifter circuit 210 are configured to set the voltage of first node n3.

For example, in some embodiments, if NMOS transistors m5 and m7 are turned on, transistors m5 and m7 are configured to pull first node n3 towards reference voltage VSS. Similarly, in some embodiments, if NMOS transistors m13 and m15 are turned on, transistors m13 and m15 are configured to pull first node n3 towards reference voltage VSS. For example, in some embodiments, if PMOS transistors m1 and m3 are turned on, PMOS transistors m1 and m3 are configured to pull first node n3 towards supply voltage VDDO. Similarly, in some embodiments, if PMOS transistors m9 and m11 are turned on, PMOS transistors m9 and m11 are configured to pull first node n3 towards supply voltage VDDO.

Feedback circuit 230 is an embodiment of feedback circuit 130 of FIG. 1A, and similar detailed description is omitted. Feedback circuit 230 is configured to receive enable signal EN, inverted enable signal ENB and feedback signal FS2. Feedback circuit 230 is coupled to at least the second voltage supply node 2N or the second node n4 of level shifter circuit 210. Feedback circuit 230 comprises PMOS transistors m10 and m12 and NMOS transistors m14 and m16. Each of PMOS transistors m10 and m12 and NMOS transistors m14 and m16 is configured to operate in the VDDO voltage domain.

A gate terminal of PMOS transistor m10 is coupled to at least a node n7 of output circuit 240 and configured to receive the feedback signal FS2. PMOS transistor m10 is turned on or off based on feedback signal FS2. A source terminal of PMOS transistor m10 is coupled with second voltage supply node 2N. A drain terminal of PMOS transistor m10 is coupled with a source terminal of PMOS transistor m12.

A gate terminal of PMOS transistor m12 is coupled to at least node n30 and configured to receive enable signal EN. PMOS transistor m12 is turned on or off based on enable signal EN. A drain terminal of PMOS transistor m12 is coupled with at least the second node n4.

A gate terminal of NMOS transistor m14 is coupled to at least node n32 and configured to receive inverted enable signal ENB. NMOS transistor m14 is turned on or off based on inverted enable signal ENB. A drain terminal of NMOS transistor m14 and the drain terminal of PMOS transistor m12 are coupled to each other at second node n4. A source terminal of NMOS transistor m14 and a drain terminal of NMOS transistor m16 are coupled to each other.

A gate terminal of NMOS transistor m16 is coupled to at least node n7 of output circuit 240 and configured to receive feedback signal FS2. In some embodiments, each of the gate terminal of NMOS transistor m16, node n7 of output circuit 240 and the gate terminal of PMOS transistor m10 are coupled together. NMOS transistor m16 is turned on or off based on feedback signal FS2. A source terminal of NMOS transistor m16 is coupled with at least the reference supply node VSS.

NMOS transistor m14, NMOS transistor m16, PMOS transistor m10 and PMOS transistor m12 are referred to as a second feedback path of feedback circuit 230. The first feedback path of feedback circuit 220 and the second feedback path of feedback circuit 230 are enabled or disabled by at least enable signal EN.

Feedback circuit 230 or level shifter circuit 210 is configured to set the voltage of second node n4 which corresponds to first signal SH1. NMOS transistors m14 and m16 and PMOS transistors m10 and m12 of feedback circuit 230 or NMOS transistors m6 and m8 and PMOS transistors m2 and m4 of level shifter circuit 210 are configured to set the voltage of second node n4.

For example, in some embodiments, if NMOS transistors m6 and m8 are turned on, transistors m6 and m8 are configured to pull second node n4 towards reference voltage VSS. Similarly, in some embodiments, if NMOS transistors m14 and m16 are turned on, transistors m14 and m16 are configured to pull second node n4 towards reference voltage VSS. For example, in some embodiments, if PMOS transistors m2 and m4 are turned on, PMOS transistors m2 and m4 are configured to pull second node n4 towards supply voltage VDDO. Similarly, in some embodiments, if PMOS transistors m10 and m12 are turned on, PMOS transistors m10 and m12 are configured to pull second node n4 towards supply voltage VDDO.

Level shifter circuit 210 and feedback circuits 220 and 230 operate in a complementary manner. For example, in some embodiments, if the level shifter circuit 210 is enabled, then feedback circuits 220 and 230 are disabled, and vice versa. For example, in some embodiments, if the level shifter circuit 210 is disabled, then feedback circuits 220 and 230 are enabled, and vice versa.

For example, in some embodiments, if level shifter circuit 210 is enabled, then NMOS transistor m5 of the first input path of level shifter circuit 210 and NMOS transistor m6 of the second input path of level shifter circuit 210 will be enabled or turned on by enable signal EN. Similarly, if feedback circuit 220 and feedback circuit 230 are disabled, then NMOS transistor m13 of the first feedback path of feedback circuit 220 and NMOS transistor m14 of the second feedback path of feedback circuit 230 will be disabled or turned off by inverted enable signal ENB, and PMOS transistor m11 of the first feedback path of feedback circuit 220 and PMOS transistor m12 of the second feedback path of feedback circuit 230 will be disabled or turned off by enable signal EN.

For example, in some embodiments, if the level shifter circuit 200 is disabled, then NMOS transistor m5 of the first input path of level shifter circuit 210 and NMOS transistor m6 of the second input path of level shifter circuit 210 will be disabled or turned off by enable signal EN. Similarly, if feedback circuit 220 and feedback circuit 230 are enabled, then NMOS transistor m13 of the first feedback path of feedback circuit 220 and NMOS transistor m14 of the second feedback path of feedback circuit 230 will be enabled or turned on by inverted enable signal ENB, and PMOS transistor m11 of the first feedback path of feedback circuit 220 and PMOS transistor m12 of the second feedback path of feedback circuit 230 will be enabled or turned on by enable signal EN.

In some embodiments, if EN has a high logical value (e.g. "1"), then level shifter circuit 210 and NMOS transistors m5 and m6 are enabled, NMOS transistor m13 and PMOS transistor m11 of feedback circuit 220 are disabled, and NMOS transistor m14 and PMOS transistor m12 of feedback circuit 230 are disabled. In these embodiments, if level shifter circuit 210 is enabled or feedback circuits 220 and 230 are disabled, then level shifter circuit 210 will output a level shifted version (e.g., first signal SH1 or second signal SH2) of input signal IN, and the output signal OUT of output circuit 240 will correspond to the level shifted version (e.g., first signal SH1 or second signal SH2) of input signal IN.

In some embodiments, if EN has a low logical value (e.g. "0"), then level shifter circuit 210 and NMOS transistors m5 and m6 are disabled, NMOS transistor m13 and PMOS transistor m11 of feedback circuit 220 are enabled, and NMOS transistor m14 and PMOS transistor m12 of feedback circuit 230 are enabled. In these embodiments, if level shifter circuit 210 is disabled or feedback circuits 220 and 230 are enabled, then the output circuit 240 will output an output signal OUT that corresponds to a previous or latched state of output signal OUT.

Other values for enable signal EN, inverted enable signal ENB, transistors types or configurations in level shifter circuit 210, feedback circuit 220, and feedback circuit 230 are within the scope of the present disclosure.

Output circuit 240 is an embodiment of output circuit 140 of FIG. 1A, and similar detailed description is omitted. Output circuit 240 is configured to receive at least enable signal EN, inverted enable signal ENB or first signal SH1. Output circuit 240 is configured to generate at least output signal OUT or the set of feedback signals FS responsive to at least first signal SH1, enable signal EN or inverted enable signal ENB. Output circuit 240 is coupled to at least the second voltage supply node 2N, the second node n4 of level shifter circuit 210, feedback circuit 220 or feedback circuit 230. Output circuit 240 is configured to output feedback signal FS1 to feedback circuit 220, and to output feedback signal FS2 to output circuit 230.

Output circuit 240 comprises PMOS transistors m20 and m21, NMOS transistors m22 and m23, an inverter 242, an inverter 244, an inverter 246, an inverter 248, an inverter 250 and a transmission gate 252. Each of PMOS transistors m20 and m21, NMOS transistors m22 and m23, inverters 242, 244, 246, 248 and 250 and transmission gate 252 is configured to operate in the VDDO voltage domain.

PMOS transistors m20 and m21 and NMOS transistors m22 and m23 are coupled to level shifter circuit 210 and feedback circuit 230 by the second node n4. PMOS transistors m20 and m21 and NMOS transistors m22 and m23 are configured to generate output signal OUT in response to at least first signal SH1, enable signal EN or inverted enable signal ENB.

In some embodiments, if enable signal EN is logically high, then PMOS transistors m20 and m21 and NMOS transistors m22 and m23 are configured as an inverter.

A gate terminal of PMOS transistor m20 is coupled to at least a gate terminal of NMOS transistor m23 or the second node n4 of level shifter circuit 210. The gate terminal of PMOS transistor m20 and the gate terminal of NMOS transistor m23 are configured to receive the first signal SH1. PMOS transistor m20 is turned on or off based on first signal SH1. A source terminal of PMOS transistor m20 is coupled with second voltage supply node 2N. A drain terminal of PMOS transistor m20 is coupled with a source terminal of PMOS transistor m21.

A gate terminal of PMOS transistor m21 is coupled to at least node n32 and configured to receive inverted enable signal ENB. PMOS transistor m21 is turned on or off based on inverted enable signal ENB. Each of a drain terminal of PMOS transistor m21, a drain terminal of NMOS transistor m22, an input terminal of inverter 242, an input terminal of inverter 248, an output terminal of transmission gate 252 and a node n5 are coupled to each other.

A gate terminal of NMOS transistor m22 is coupled to at least node n30 and configured to receive enable signal EN. NMOS transistor m22 is turned on or off based on enable signal EN. A source terminal of NMOS transistor m22 and a drain terminal of NMOS transistor m23 are coupled to each other.

The gate terminal of NMOS transistor m23 is coupled to at least the gate terminal of PMOS transistor m20 or the second node n4 of level shifter circuit 210. The gate terminal of NMOS transistor m23 is configured to receive first signal SH1. NMOS transistor m23 is turned on or off based on first signal SH1. A source terminal of NMOS transistor m23 is coupled with at least the reference supply node VSS.

Each of the drain terminal of NMOS transistor m14, the drain terminal of PMOS transistor m12, the drain terminal of NMOS transistor m6, the drain terminal of PMOS transistor m4, the gate terminal of PMOS transistor m1, the gate terminal of PMOS transistor m20 and the gate terminal of NMOS transistor m23 are coupled to each other at second node n4.

Inverter 242 is coupled between node n5 and a node n8. Inverter 242 is configured to generate an inverted output signal OUTB in response to output signal OUT. An input terminal of inverter 242 is coupled to at least the drain terminal of PMOS transistor m21, the drain terminal of NMOS transistor m22, the output terminal of transmission gate 252 or node n5. The input terminal of inverter 242 is configured to receive the output signal OUT from at least node n5. An output terminal of inverter 242 is coupled to at least node n8, an input terminal of inverter 244 or an input terminal of inverter 246. The output terminal of inverter 242 is configured to output the inverted output signal OUTB to at least node n8, the input terminal of inverter 244 or the input terminal of inverter 246.

Inverter 244 is coupled between node n8 and an output node of circuit 200. Inverter 244 is configured to generate output signal OUT in response to the inverted output signal OUTB. The input terminal of inverter 244 is coupled to at least node n8, the output terminal of inverter 242 or the input terminal of inverter 246. The input terminal of inverter 244 is configured to receive the inverted output signal OUTB from inverter 242. An output terminal of inverter 244 is coupled to the output node of circuit 200. The output terminal of inverter 244 is configured to output the output signal OUT to the output node of circuit 200.

Inverter 246 is coupled between node n8 and transmission gate 252. Inverter 246 is configured to generate output signal OUT in response to the inverted output signal OUTB. The input terminal of inverter 246 is coupled to at least node n8, the output terminal of inverter 242 or the input terminal of inverter 244. The input terminal of inverter 242 is configured to receive the inverted output signal OUTB from at least node n8. An output terminal of inverter 246 is coupled to an input terminal of transmission gate 252. The output terminal of inverter 246 is configured to output the output signal OUT to the input terminal of transmission gate 252.

Inverter 248 is coupled between node n5 and node n6. Inverter 248 is configured to generate feedback signal FS1 in response to output signal OUT. In some embodiments, feedback signal FS1 corresponds to the inverted output signal OUTB. An input terminal of inverter 248 is coupled to at least the drain terminal of PMOS transistor m21, the drain terminal of NMOS transistor m22, the output terminal of transmission gate 252, node n5 or the input terminal of inverter 242. The input terminal of inverter 248 is configured to receive the output signal OUT from at least node n5. An output terminal of inverter 248 is coupled to at least node n6, an input terminal of inverter 250, the gate terminal of PMOS transistor m9 or the gate terminal of NMOS transistor m15. The output terminal of inverter 248 is configured to output feedback signal FS1 to at least node n6, input terminal of inverter 250, the gate terminal of PMOS transistor m9 or the gate terminal of NMOS transistor m15.

Inverter 250 is coupled between node n6 and node n7. Inverter 250 is configured to generate feedback signal FS2 in response to feedback signal FS1. In some embodiments, feedback signal FS2 corresponds to output signal OUT. An input terminal of inverter 250 is coupled to at least the output terminal of inverter 248, node n6, the gate terminal of PMOS transistor m9 or the gate terminal of NMOS transistor m15. The input terminal of inverter 250 is configured to receive feedback signal FS1 from inverter 248 by node n6. An output terminal of inverter 250 is coupled to at least node n7, the gate terminal of PMOS transistor m10 or the gate terminal of NMOS transistor m16. The output terminal of inverter 250 is configured to output feedback signal FS2 to at least node n7, the gate terminal of PMOS transistor m10 or the gate terminal of NMOS transistor m16.

Transmission gate 252 is coupled between the output terminal of inverter 246 and node n5. Transmission gate 252 has a first input terminal configured to receive enable signal EN, a second input terminal configured to receive inverted enable signal ENB and a third input terminal configured to receive output signal OUT. Transmission gate 252 has an output terminal configured to output enable signal EN.

Transmission gate 252 comprises a PMOS transistor m24 and an NMOS transistor m25. A gate terminal of PMOS transistor m24 is coupled to at least node n30 and configured to receive enable signal EN. A gate terminal of NMOS transistor m25 is coupled to at least node n32 and configured to receive inverted enable signal ENB. PMOS transistor m24 is turned on or off based on enable signal EN. NMOS transistor m25 is turned on or off based on inverted enable signal ENB. One of a drain or a source terminal of PMOS transistor m24 is coupled to one of a drain or a source terminal of NMOS transistor m25, and is configured as the third input terminal of transmission gate 252. The other of the source or the drain source terminal of PMOS transistor m24 is coupled to the other of the source or the drain terminal of NMOS transistor m25, and is configured as the output terminal of transmission gate 252.

Transmission gate 252 is enabled (e.g., turned on) or disabled (e.g., turned off) in response to enable signal EN and inverted enable signal ENB. If enabled, transmission gate 252 is configured to output or pass the output signal OUT to at least node n5. If disabled, transmission gate 252 does not pass or output the output signal OUT to node n5.

In some embodiments, inverter 242, inverter 246 and transmission gate 252 are configured as a latch circuit (not labelled) configured to latch a previous state of the output signal OUT responsive to at least enable signal EN or the inverted enable signal.

In some embodiments, if level shifter circuit 210 is disabled by enable signal EN or feedback circuits 220 and 230 are enabled by enable signal EN, then the latch circuit (e.g., inverter 242, inverter 246 and transmission gate 252) is enabled by at least enable signal EN or inverted enable signal ENB, and the output signal OUT is a latched or a previous state of the output signal OUT.

In some embodiments, if level shifter circuit 210 is enabled by enable signal EN or feedback circuits 220 and 230 are disabled by enable signal EN, then the output signal OUT is a level shifted version of input signal IN. In these embodiments, the output signal OUT is also inverted from the first signal SH1.

In some embodiments, by including NMOS transistor m5 in the first path of level shifter circuit 210, and by including NMOS transistor m6 in the second path of level shifter circuit 210, short circuit currents in the first path and the second path of level shifter circuit 210 are prevented when level shifter circuit 210 is disabled by the enable signal EN resulting in lower power consumption than other approaches.

Figure 3:
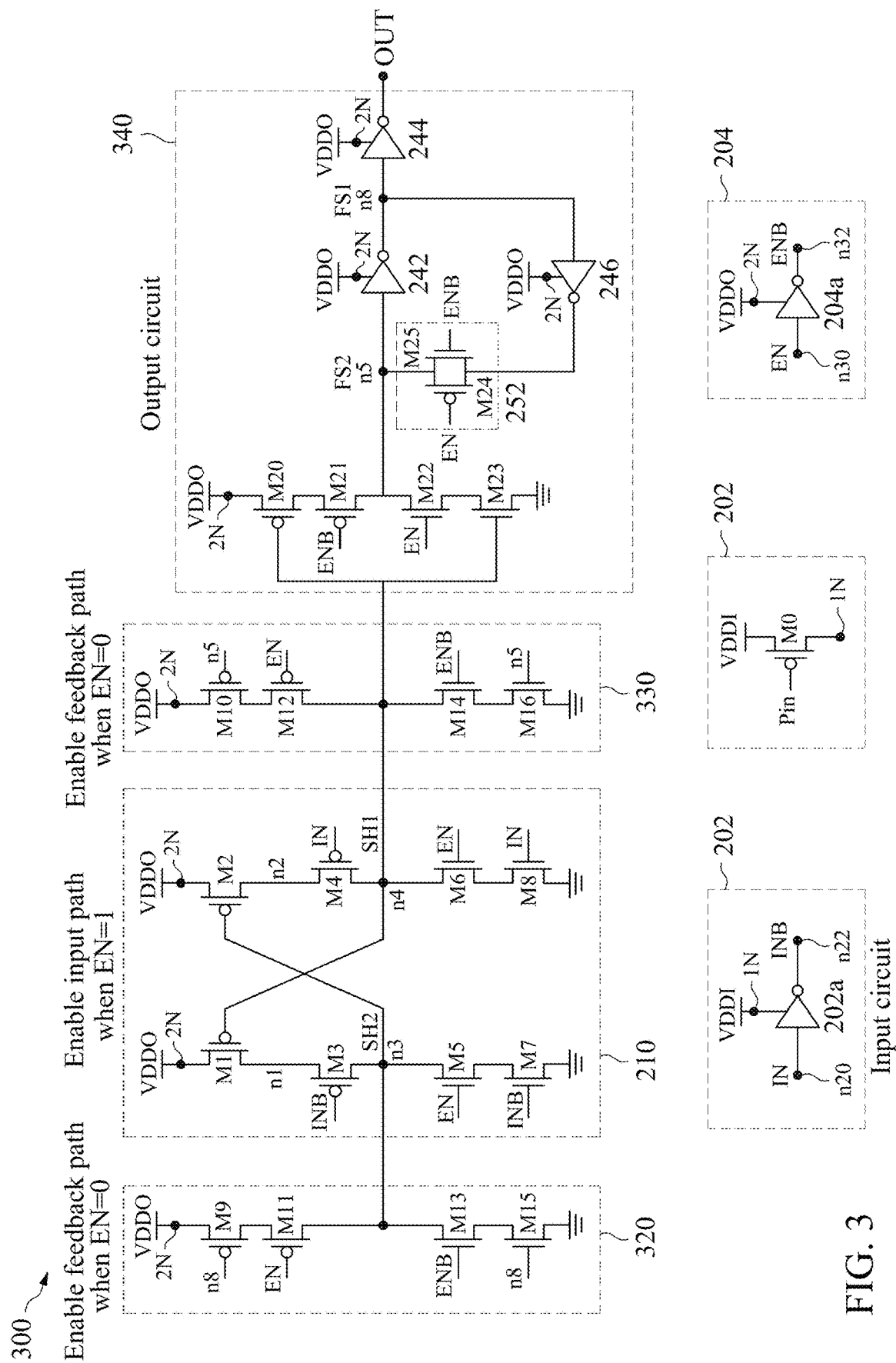
FIG. 3 is a circuit diagram of a circuit, in accordance with some embodiments.

FIG. 3 is a circuit diagram of a circuit 300, in accordance with some embodiments. Circuit 300 is an embodiment of integrated circuit 100A of FIG. 1A, and similar detailed description is therefore omitted.

Circuit 300 is a variation of circuit 200 of FIG. 2, and similar detailed description is therefore omitted. In comparison with circuit 200 of FIG. 2, feedback signal FS2 of circuit 300 corresponds to the signal at node n5, and feedback signal FS1 of circuit 300 corresponds to the signal at node n8. In other words, control of feedback circuit 320 is changed by connecting feedback circuit 320 to node n8, and control of feedback circuit 330 is changed by connecting feedback circuit 330 to node n5.

In comparison with circuit 200 of FIG. 2, feedback circuit 320 replaces feedback circuit 220, feedback circuit 330 replaces feedback circuit 230 and output circuit 340 replaces output circuit 240, and similar detailed description is therefore omitted.

In comparison with output circuit 240 of FIG. 2, output circuit 340 does not include inverter 248, inverter 250, and nodes n6 and n7, and therefore feedback signal FS1 of circuit 300 is not generated by inverter 248, and feedback signal FS2 of circuit 300 is not generated by inverter 250.

In comparison with feedback circuit 220 of FIG. 2, the gate terminal of PMOS transistor m9 of feedback circuit 320 and the gate terminal of NMOS transistor m15 of feedback circuit 320 are coupled to node n8. Feedback signal FS1 corresponds to the signal at node n8.

Node n8 of output circuit 340 is coupled to at least the output terminal of inverter 242, the input terminal of inverter 244, the input terminal of inverter 246, the gate terminal of PMOS transistor m9 or the gate terminal of NMOS transistor m15. Inverter 242 of output circuit 340 is configured to generate feedback signal FS1 in response to feedback signal FS2 or output signal OUT. Thus, inverter 242 is configured to control feedback circuit 320 by feedback signal FS1.

In comparison with feedback circuit 230 of FIG. 2, the gate terminal of PMOS transistor m10 of feedback circuit 330 and the gate terminal of NMOS transistor m16 of feedback circuit 330 are coupled to node n5.

Node n5 of output circuit 340 is coupled to at least the drain terminal of PMOS transistor m21, the drain terminal of NMOS transistor m22, the output terminal of transmission gate 252, the input terminal of inverter 242, the gate terminal of PMOS transistor m10 or the gate terminal of NMOS transistor m16. Feedback signal FS2 corresponds to the signal at node n5.

Feedback signal FS2 of circuit 300 is generated by transmission gate 252 or by PMOS transistors m20 and m21 and NMOS transistors m22 and m23. Feedback circuit 330 is configured to be controlled by transmission gate 252 of output circuit 340 or controlled by PMOS transistors m20 and m21 and NMOS transistors m22 and m23 of output circuit 340. Feedback circuit 330 is controlled by feedback signal FS2.

In some embodiments, by including NMOS transistor m5 in the first path of level shifter circuit 210, and by including NMOS transistor m6 in the second path of level shifter circuit 210, short circuit currents in the first path and the second path of level shifter circuit 210 are prevented when level shifter circuit 210 is disabled by the enable signal EN resulting in lower power consumption than other approaches. In some embodiments, by using a different output circuit 340 such that feedback circuit 320 is coupled to node n8 or feedback circuit 330 is coupled to node n5, circuit 300 includes less circuit elements than other approaches resulting in less lower power consumption and less area than other approaches.

Figure 4:
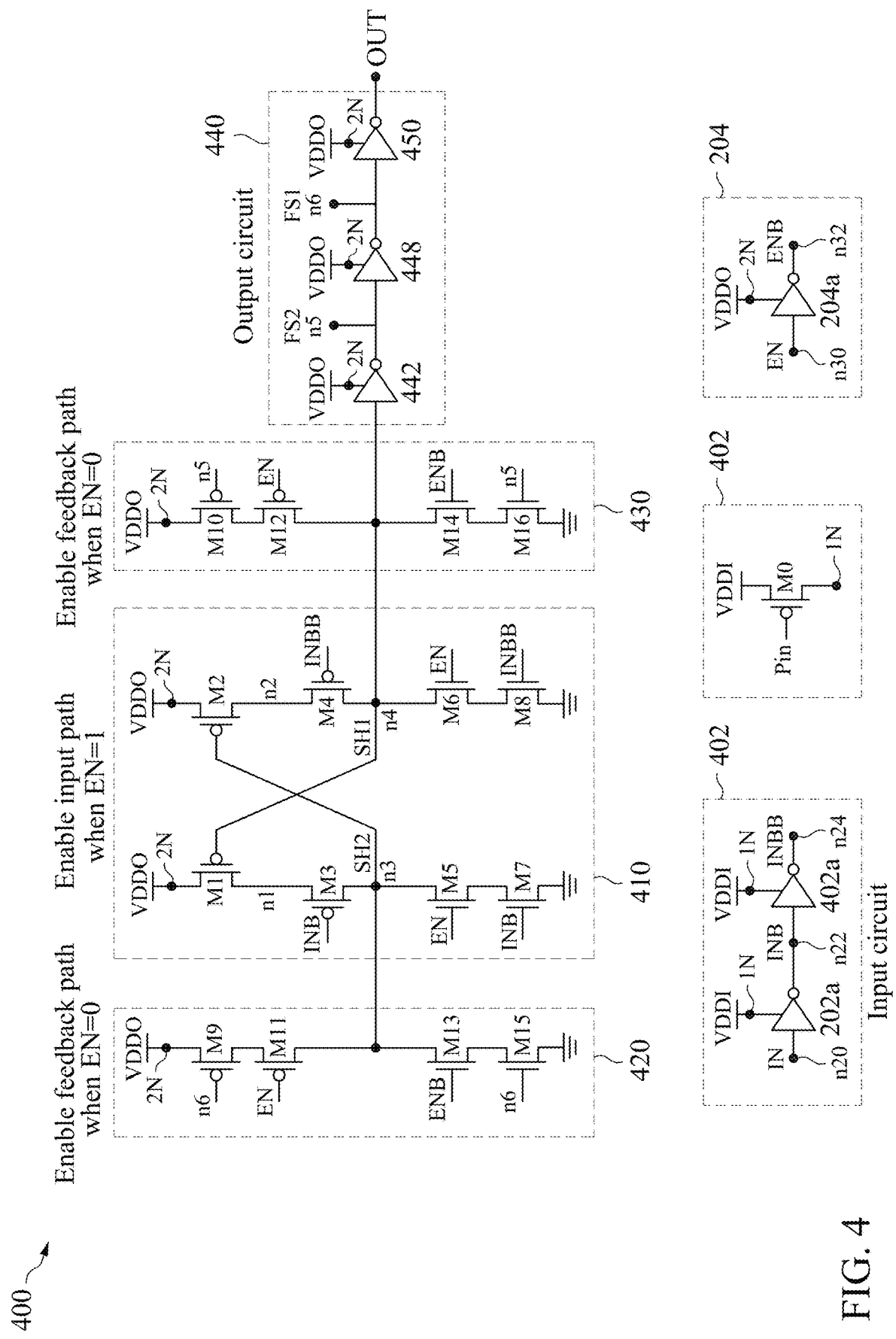
FIG. 4 is a circuit diagram of a circuit, in accordance with some embodiments.

FIG. 4 is a circuit diagram of a circuit 400, in accordance with some embodiments. Circuit 400 is an embodiment of integrated circuit 100A of FIG. 1A, and similar detailed description is therefore omitted.

Circuit 400 is a variation of circuit 200 of FIG. 2, and similar detailed description is therefore omitted. In comparison with circuit 200 of FIG. 2, feedback circuit 420 and feedback circuit 430 are configured to assist with latching the output signal OUT. Furthermore, in comparison with circuit 200 of FIG. 2, feedback signal FS2 of circuit 400 corresponds to the signal at node n5, and feedback signal FS1 of circuit 400 corresponds to the signal at node n6. In other words, control of feedback circuit 420 is changed by connecting feedback circuit 420 to node n6, and control of feedback circuit 430 is changed by connecting feedback circuit 430 to node n5. Furthermore, in comparison with circuit 200 of FIG. 2, feedback circuit 420 and feedback circuit 430 are configured to latch output signal OUT.

In comparison with circuit 200 of FIG. 2, input circuit 402 replaces input circuit 202, level shifter circuit 410 replaces level shifter circuit 210, feedback circuit 420 replaces feedback circuit 220, feedback circuit 430 replaces feedback circuit 230 and output circuit 440 replaces output circuit 240, and similar detailed description is therefore omitted.

Input circuit 402 is an embodiment of input circuit 202 of FIGS. 1A-1B, and similar detailed description is omitted.

Input circuit 402 is a variation of input circuit 202 of FIG. 2. Input circuit 402 comprises inverter 202a, an inverter 402a and PMOS transistor m0. Inverter 402a is coupled to each of inverter 202a and PMOS transistor m0. For ease of illustration, inverter 202a, inverter 402a and PMOS transistor m0 are not shown as being coupled to each other. An output terminal (e.g., node n22) of inverter 202a is coupled to an input terminal of inverter 402a. Inverter 402a is coupled to PMOS transistor m0 by the first voltage supply node 1N. Inverter 402a is configured to operate in the VDDI voltage domain. Inverter 402a is configured to generate an input signal INBB in response to input signal INB. An input terminal of inverter 402a is configured to receive input signal INB. An output terminal (e.g., node n24) of inverter 402a is configured to output input signal INBB. Input circuit 402, inverter 202a and inverter 402a are coupled to level shifter circuit 410. For ease of illustration, input circuit 402, inverter 202a and inverter 402a are not shown as being coupled to level shifter circuit 410. PMOS transistor m0 is configured to provide supply voltage VDDI to the first voltage supply node IN, inverter 202a and inverter 402a. In comparison with input circuit 200 of FIG. 2, the source terminal of PMOS transistor m0 is coupled with the first voltage supply node IN, inverter 202a and inverter 402a. In some embodiments, turning on the input power to circuit 400 comprises turning on PMOS transistor m0 responsive to power enable signal Pin, such that PMOS transistor m0 provides supply voltage VDDI to the first voltage supply node 1N, inverter 202a and inverter 402a. In some embodiments, turning off the input power to circuit 400 comprises turning off PMOS transistor m0 responsive to power enable signal Pin, such that PMOS transistor m0 does not provide supply voltage VDDI to the first voltage supply node IN, inverter 202a and inverter 402a. Other transistor types in input circuit 402 are within the scope of the present disclosure.

In comparison with level shifter circuit 210 of FIG. 2, the gate terminal of PMOS transistor m3 of level shifter circuit 410 and the gate terminal of NMOS transistor m7 of level shifter circuit 410 are coupled to node n22 of input circuit 402, and configured to receive input signal INB. In comparison with level shifter circuit 210 of FIG. 2, the gate terminal of PMOS transistor m4 of level shifter circuit 410 and the gate terminal of NMOS transistor m8 of level shifter circuit 410 are coupled to node n24 of input circuit 402, and configured to receive input signal INBB.

In comparison with output circuit 240 of FIG. 2, output circuit 440 includes an inverter 442, an inverter 448 and an inverter 450. Output circuit 440 and inverters 442, 448 and 450 are configured to operate in the VDDO voltage domain.

Inverter 442 is coupled between the second node n4 of level shifter circuit 410 and node n5 of circuit 400. Inverter 442 is configured to generate the output signal OUT (e.g., the feedback signal FS2) in response to the first signal SH1. In some embodiments, the output signal OUT corresponds to feedback signal FS2. The input terminal of inverter 442 is coupled to at least the second node n4 of level shifter circuit 410. The input terminal of inverter 442 is configured to receive the first signal SH1 from level shifter circuit 410. An output terminal of inverter 442 is coupled to at least an input terminal of inverter 448 or n5 node of circuit 400. The output terminal of inverter 442 is configured to output the output signal OUT to at least the input terminal of inverter 448 or node n5.

Inverter 448 is coupled between node n5 and node n6. Inverter 448 is configured to generate an inverted output signal OUTB (e.g., feedback signal FS1) in response to output signal OUT (e.g., the feedback signal FS2). In some embodiments, the inverted output signal OUTB corresponds to feedback signal FS1. An input terminal of inverter 448 is coupled to at least the output terminal of inverter 442 or node n5. The input terminal of inverter 448 is configured to receive the output signal OUT from at least node n5. An output terminal of inverter 448 is coupled to at least node n6 or an input terminal of inverter 450. The output terminal of inverter 448 is configured to output the inverted output signal OUTB to at least node n6 or the input terminal of inverter 450.

Inverter 450 is coupled between node n6 and an output node of circuit 400. Inverter 450 is configured to generate output signal OUT in response to the inverted output signal OUTB. The input terminal of inverter 450 is coupled to at least node n6 or the output terminal of inverter 448. The input terminal of inverter 450 is configured to receive the inverted output signal OUTB from inverter 448. An output terminal of inverter 450 is coupled to the output node of circuit 400. The output terminal of inverter 450 is configured to output the output signal OUT to the output node of circuit 400.

In comparison with feedback circuit 220 of FIG. 2, the gate terminal of PMOS transistor m9 of feedback circuit 420 and the gate terminal of NMOS transistor m15 of feedback circuit 420 are coupled to at least node n6. Feedback signal FS1 corresponds to the signal at node n6.

Node n6 of output circuit 440 is coupled to at least the output terminal of inverter 448, the input terminal of inverter 450, the gate terminal of PMOS transistor m9 or the gate terminal of NMOS transistor m15. Inverter 448 of output circuit 440 is configured to generate feedback signal FS1 in response to feedback signal FS2 or output signal OUT. Thus, inverter 448 is configured to control feedback circuit 420 by feedback signal FS1.

In comparison with feedback circuit 230 of FIG. 2, the gate terminal of PMOS transistor m10 of feedback circuit 430 and the gate terminal of NMOS transistor m16 of feedback circuit 430 are coupled to node n5. Feedback signal FS2 corresponds to the signal at node n5.

Node n5 of output circuit 440 is coupled to at least the input terminal of inverter 448, the output terminal of inverter 442, the gate terminal of PMOS transistor m10 or the gate terminal of NMOS transistor m16. Inverter 442 of output circuit 440 is configured to generate feedback signal FS2 (or inverted output signal OUTB) in response to first signal SH1. Thus, inverter 442 is configured to control feedback circuit 430 by feedback signal FS2.

In some embodiments, by including NMOS transistor m5 in the first path of level shifter circuit 410, and by including NMOS transistor m6 in the second path of level shifter circuit 410, short circuit currents in the first path and the second path of level shifter circuit 410 are prevented when level shifter circuit 410 is disabled by the enable signal EN resulting in lower power consumption than other approaches. In some embodiments, by using a different output circuit 440 such that feedback circuit 420 is coupled to node n6 or feedback circuit 430 is coupled to node n5, circuit 400 includes less circuit elements than other approaches resulting in less power consumption and less area than other approaches. In some embodiments, by using circuit 400, feedback circuit 420 and feedback circuit 430 are configured to assist with latching of the output data signal OUT, and therefore circuit 400 includes less circuit elements than other approaches resulting in less lower power consumption and less area than other approaches.

Figure 5:
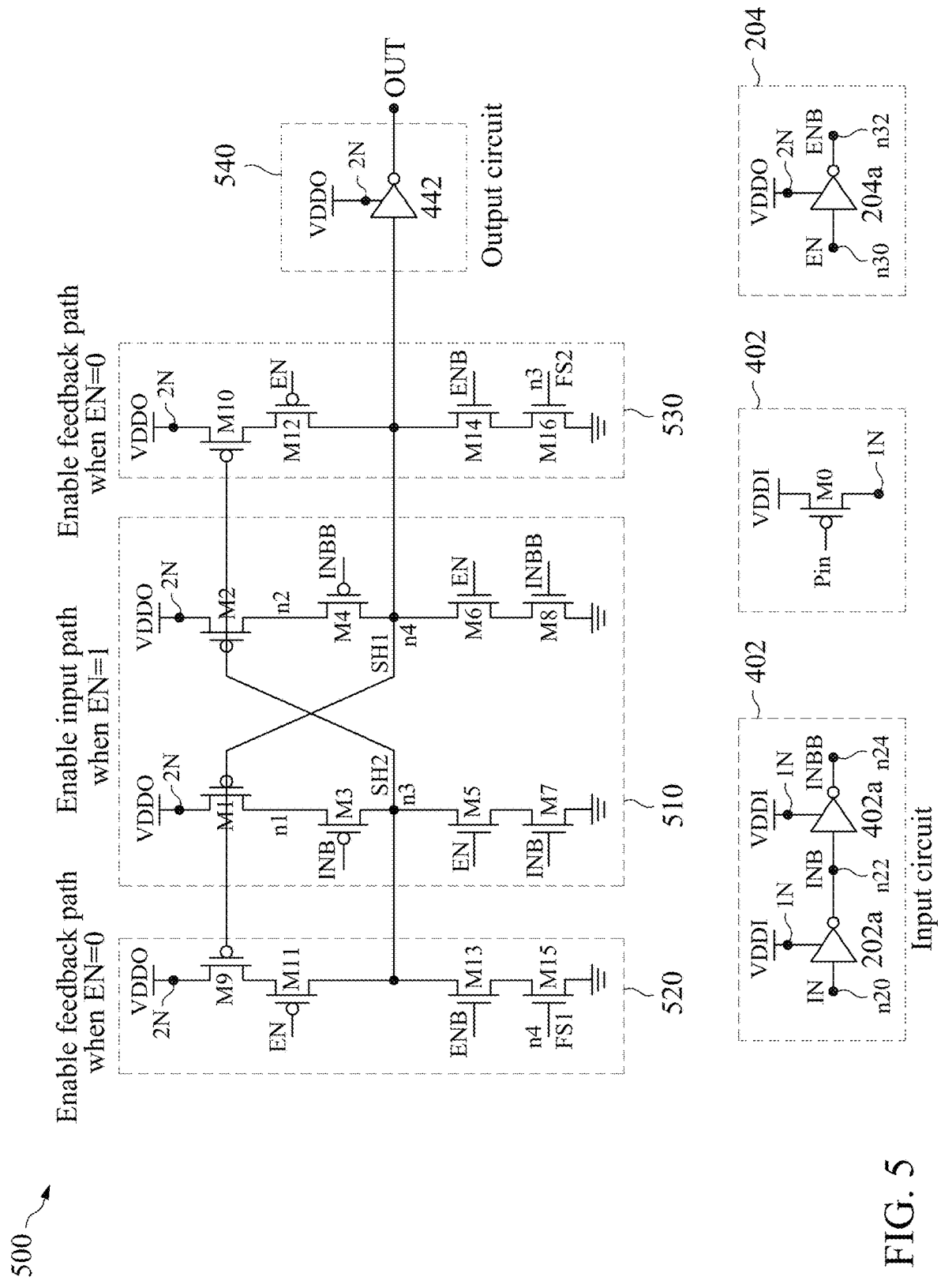
FIG. 5 is a circuit diagram of a circuit, in accordance with some embodiments.

FIG. 5 is a circuit diagram of a circuit 500, in accordance with some embodiments. Circuit 500 is an embodiment of integrated circuit 100B of FIG. 1B and similar detailed description is therefore omitted.

Circuit 500 includes enable circuit 204, input circuit 402, a level shifter circuit 510, a feedback circuit 520, a feedback circuit 530 and an output circuit 540. Level shifter circuit 510 is an embodiment of level shifter circuit 110' of FIG. 1B, and similar detailed description is omitted. Feedback circuits 520 and 530 are embodiments of corresponding feedback circuits 120' and 130' of FIG. 1B, and similar detailed description is omitted. Output circuit 540 is an embodiment of output circuit 140' of FIG. 1B, and similar detailed description is omitted.

Circuit 500 is a variation of circuit 400 of FIG. 4, and similar detailed description is therefore omitted. In comparison with circuit 400 of FIG. 4, the set of feedback signals FS (FS1, FS2) are generated by a level shifter circuit 510. Thus, first signal SH1 of FIG. 5 corresponds to feedback signal FS1, and second signal SH2 of FIG. 1B corresponds to feedback signal FS2.

In comparison with circuit 400 of FIG. 4, level shifter circuit 510 replaces level shifter circuit 410, feedback circuit 520 replaces feedback circuit 420, feedback circuit 530 replaces feedback circuit 430 and output circuit 540 replaces output circuit 440, and similar detailed description is therefore omitted.

In comparison with FIGS. 2-4 and 8, output circuit 540 of FIG. 5 or FIGS. 6-7 and 9 (described below) do not latch the output signal OUT. In some embodiments, feedback circuits 520 and 530 are configured to latch or maintain a previous state of the output signal OUT in response to at least feedback signal FS1 (first signal SH1), feedback signal FS2 (second signal SH2), enable signal EN, inverted enable signal ENB, input signal INB or input signal INBB.

In comparison with output circuit 440 of FIG. 4, output circuit 540 does not include inverter 448, inverter 450, node n5, and node n6. The output terminal of inverter 442 of output circuit 540 is coupled to the output node of circuit 500. In comparison with output circuit 440 of FIG. 4, feedback signal FS1 and feedback signal FS2 of circuit 500 are not generated by output circuit 540.

In comparison with level shifter circuit 410 and feedback circuit 420 of FIG. 4, each of the gate terminal of PMOS transistor m9 of feedback circuit 520, the gate terminal of NMOS transistor m15 of feedback circuit 520, the gate terminal of PMOS transistor m1 of level shifter circuit 510 and node n4 are coupled to each other. Feedback signal FS1 corresponds to first signal SH1 at node n4. In some embodiments, feedback signal FS1 of circuit 500 is generated by level shifter circuit 510 or feedback circuit 530. In these embodiments, level shifter circuit 510 or feedback circuit 530 is configured to control feedback circuit 520 by feedback signal FS1.

In comparison with level shifter circuit 410 and feedback circuit 430 of FIG. 4, each of the gate terminal of PMOS transistor m10 of feedback circuit 530, the gate terminal of NMOS transistor m16 of feedback circuit 530, the gate terminal of PMOS transistor m2 of level shifter circuit 510 and node n3 are coupled to each other. Feedback signal FS2 corresponds to second signal SH2 at node n3. In some embodiments, feedback signal FS2 of circuit 500 is generated by level shifter circuit 510 or feedback circuit 520. In these embodiments, level shifter circuit 510 or feedback circuit 520 is configured to control feedback circuit 530 by feedback signal FS2.

In some embodiments, feedback circuit 520 and feedback circuit 530 are configured to latch or maintain a previous state of the output signal OUT in response to at least feedback signal FS1 (first signal SH1), feedback signal FS2 (second signal SH2), enable signal EN, inverted enable signal ENB, input signal INB or input signal INBB. In some embodiments, level shifter circuit 510 is configured to assist feedback circuit 520 and feedback circuit 530 to latch or maintain a previous state high state (e.g., VDDO) of the output signal OUT.

In some embodiments, by including NMOS transistor m5 in the first path of level shifter circuit 510, and by including NMOS transistor m6 in the second path of level shifter circuit 510, short circuit currents in the first path and the second path of level shifter circuit 510 are prevented when level shifter circuit 510 is disabled by the enable signal EN resulting in lower power consumption than other approaches. In some embodiments, by using a different output circuit 540 in circuit 500, circuit 500 includes less circuit elements than other approaches resulting in less lower power consumption and less area than other approaches. In some embodiments, by using circuit 500, feedback circuit 520 and feedback circuit 530 are configured to latch the output signal OUT, and therefore circuit 500 includes less circuit elements than other approaches resulting in less lower power consumption and less area than other approaches. In some embodiments, by using circuit 500, level shifter circuit 510, feedback circuit 520 and feedback circuit 530 are configured to generate feedback signal FS1 and feedback signal FS2, and are configured to latch the output signal OUT, and therefore circuit 500 includes less circuit elements than other approaches resulting in less lower power consumption than other approaches.

Figure 6:
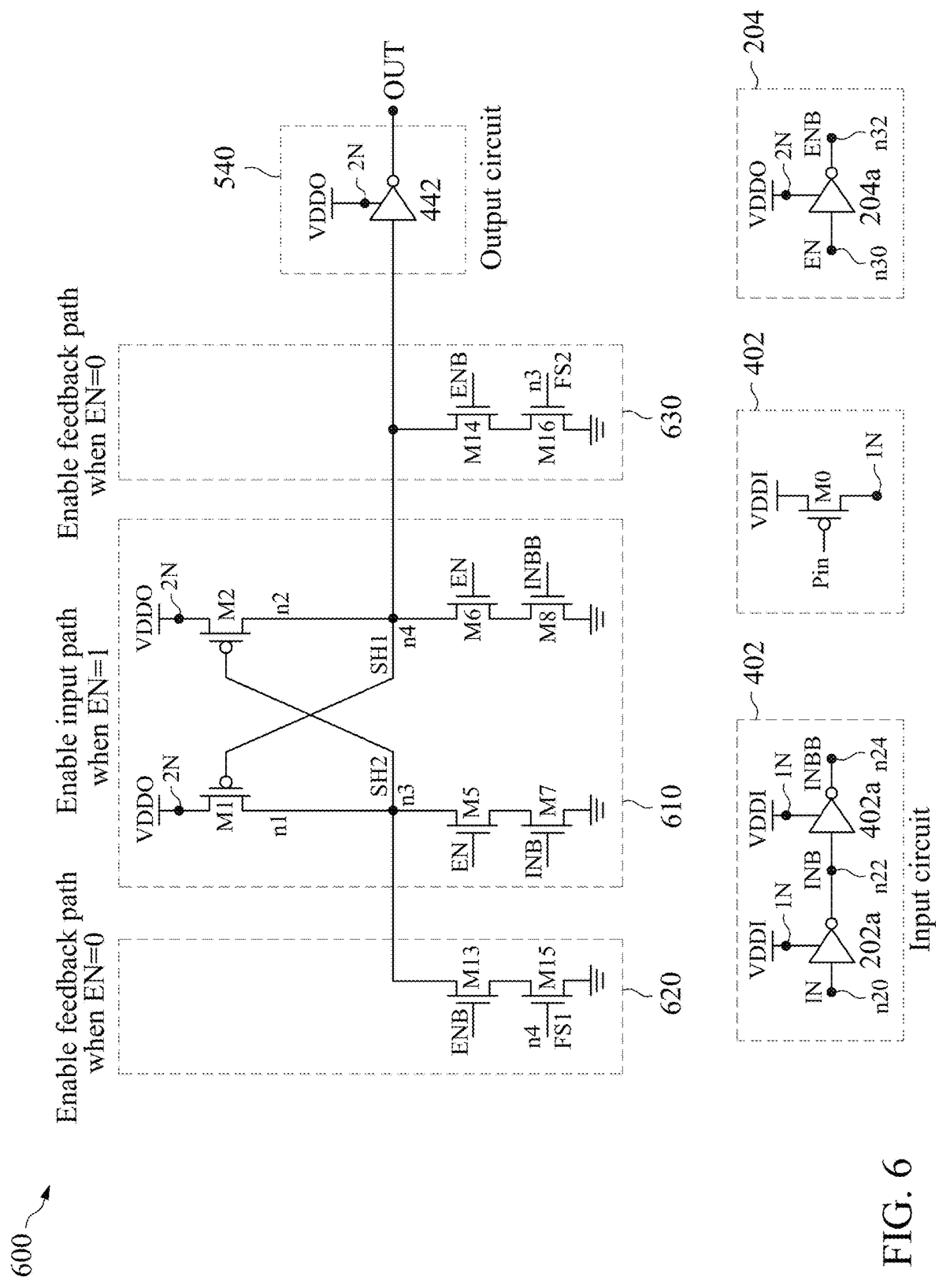
FIG. 6 is a circuit diagram of a circuit, in accordance with some embodiments.

FIG. 6 is a circuit diagram of a circuit 600, in accordance with some embodiments. Circuit 600 is an embodiment of integrated circuit 100B of FIG. 1B and similar detailed description is therefore omitted.

Circuit 600 is a variation of circuit 500 of FIG. 5, and similar detailed description is therefore omitted. In comparison with circuit 500 of FIG. 5, at least feedback circuit 620 or 630 does not include a pull-up transistor device configured to latch the high state (e.g., VDDO) of either the first node n3 or the second node n4. In other words, at least one of the pull-up transistor devices of level shifter circuit 610 is configured to latch the high state (e.g., VDDO) of either the first node n3 or the second node n4.

In comparison with circuit 500 of FIG. 5, level shifter circuit 610 replaces level shifter circuit 510, feedback circuit 620 replaces feedback circuit 520, feedback circuit 630 replaces feedback circuit 530, and similar detailed description is therefore omitted.

In comparison with level shifter circuit 510 of FIG. 5, level shifter circuit 610 does not include PMOS transistor m3 and PMOS transistor m4. In some embodiments, the drain of PMOS transistor m1 is directly coupled to the first node n3. In some embodiments, the drain of PMOS transistor m2 is directly coupled to the second node n4.

In comparison with feedback circuit 520 of FIG. 5, feedback circuit 620 does not include PMOS transistor m9 and PMOS transistor m11. In other words, feedback circuit 620 does not include pull-up transistors to pull the first node n3 towards supply voltage VDDO. By not including PMOS transistor m9 and PMOS transistor m11, feedback circuit 620 is not configured to pull the first node n3 towards supply voltage VDDO, and PMOS transistor m1 of the level shifter circuit 610, if turned on, is configured to pull the first node n3 towards supply voltage VDDO.

In comparison with feedback circuit 520 of FIG. 5, feedback circuit 630 does not include PMOS transistor m10 and PMOS transistor m12. In other words, feedback circuit 630 does not include pull-up transistors to pull the second node n4 towards supply voltage VDDO. By not including PMOS transistor m10 and PMOS transistor m12, feedback circuit 630 is not configured to pull the second node n4 towards supply voltage VDDO, and PMOS transistor m2 of the level shifter circuit 610, if turned on, is configured to pull the second node n4 towards supply voltage VDDO. In some embodiments, level shifter circuit 610 is configured to latch or maintain a previous state high state (e.g., VDDO) of the output signal OUT.

In some embodiments, by including NMOS transistor m5 in the first path of level shifter circuit 610, and by including NMOS transistor m6 in the second path of level shifter circuit 610, short circuit currents in the first path and the second path of level shifter circuit 610 are prevented when level shifter circuit 610 is disabled by the enable signal EN resulting in lower power consumption than other approaches. In some embodiments, by using a different output circuit 540 in circuit 600, circuit 600 includes less circuit elements than other approaches resulting in less lower power consumption than other approaches.

In some embodiments, by using circuit 600, feedback circuit 620 and feedback circuit 630 are configured to latch the output signal OUT, and therefore circuit 600 includes less circuit elements than other approaches resulting in less lower power consumption and less area than other approaches. In some embodiments, by using circuit 600, level shifter circuit 510, feedback circuit 620 and feedback circuit 630 are configured to generate feedback signal FS1 and feedback signal FS2, and are configured to latch the output signal OUT, and therefore circuit 600 includes less circuit elements than other approaches resulting in less lower power consumption than other approaches.

In some embodiments, by using circuit 600, level shifter circuit 610, feedback circuit 620 and feedback circuit 630 are configured to latch the output data signal OUT, and therefore circuit 600 includes less circuit elements than other approaches resulting in less lower power consumption and less area than other approaches. In some embodiments, by using circuit 600, level shifter circuit 610, feedback circuit 620 and feedback circuit 630 are configured to generate feedback signal FS1 and feedback signal FS2, and therefore circuit 600 includes less circuit elements than other approaches resulting in less lower power consumption and less area than other approaches.

Figure 7:
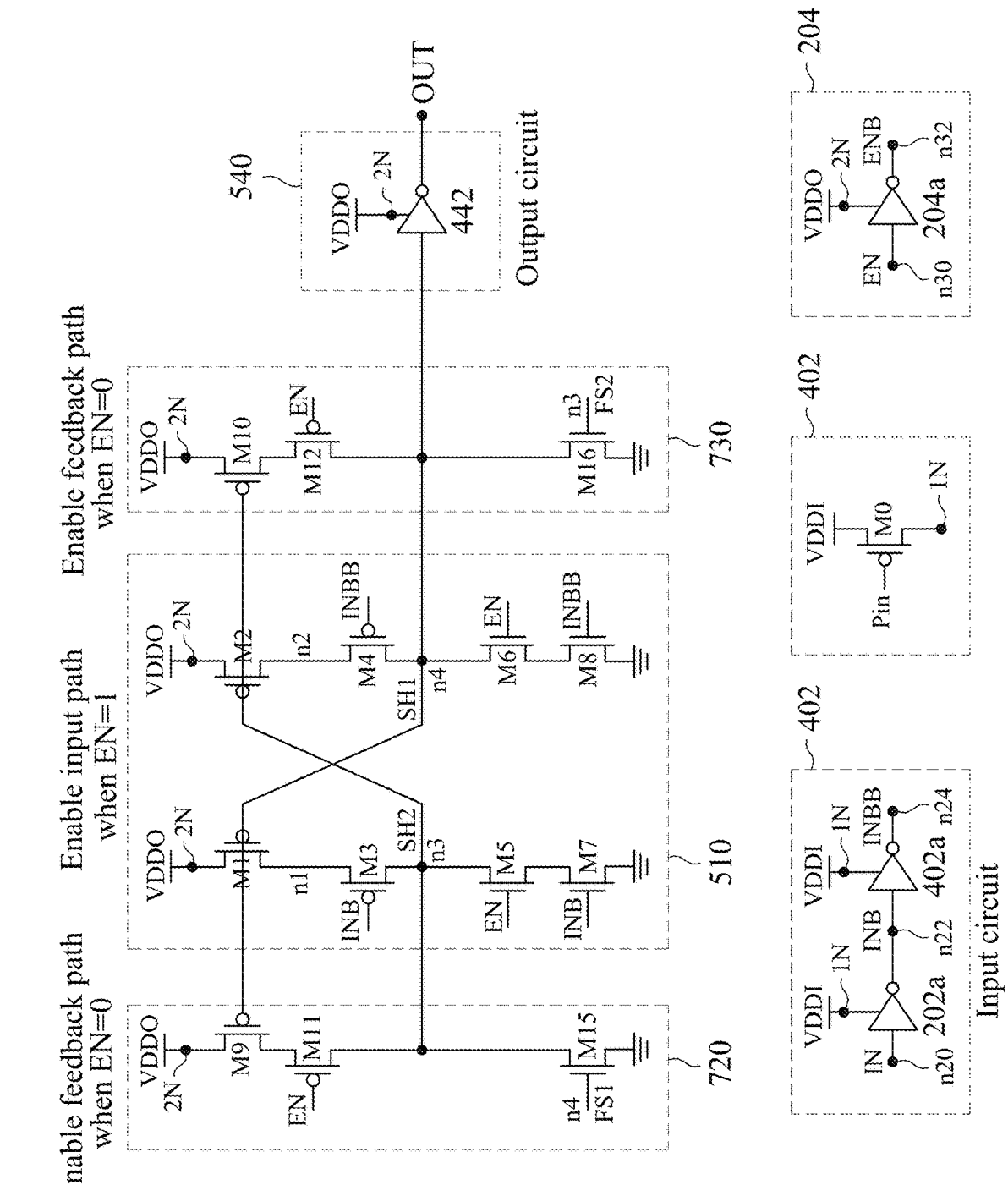
FIG. 7 is a circuit diagram of a circuit, in accordance with some embodiments.

FIG. 7 is a circuit diagram of a circuit 700, in accordance with some embodiments. Circuit 700 is an embodiment of integrated circuit 100B of FIG. 1B and similar detailed description is therefore omitted.

Circuit 700 is a variation of circuit 500 of FIG. 5, and similar detailed description is therefore omitted. In comparison with circuit 500 of FIG. 5, a number of transistors in at least feedback circuit 720 or 730 is reduced.

In comparison with circuit 500 of FIG. 5, feedback circuit 720 replaces feedback circuit 520, feedback circuit 730 replaces feedback circuit 530, and similar detailed description is therefore omitted.

In comparison with feedback circuit 520 of FIG. 5, feedback circuit 720 does not include at least NMOS transistor m13. In other words, feedback circuit 720 includes at least one less pull-down transistor in the first path of feedback circuit 720. In some embodiments, by not including at least NMOS transistor m13, control of feedback circuit 720 is simplified. In some embodiments, by not including at least NMOS transistor m13, less connections between enable circuit 204 and transistors within the feedback circuit 720 are utilized, and the complexity of the signal routing is reduced. In some embodiments, the drain of NMOS transistor m15 of feedback circuit 720 is directly coupled to at least the first node n3. Other configurations, number of transistors or transistor types of feedback circuit 720 are within the scope of the present disclosure.

In comparison with feedback circuit 530 of FIG. 5, feedback circuit 730 does not include at least NMOS transistor m13. In other words, feedback circuit 730 includes at least one less pull-down transistor in the first path of feedback circuit 730. In some embodiments, by not including at least NMOS transistor m14, control of feedback circuit 730 is simplified. In some embodiments, by not including at least NMOS transistor m14, less connections between enable circuit 204 and transistors within the feedback circuit 730 are utilized, and the complexity of the signal routing is reduced. In some embodiments, the drain of NMOS transistor m16 of feedback circuit 730 is directly coupled to at least the second node n4. Other configurations, number of transistors or transistor types of feedback circuit 730 are within the scope of the present disclosure.

In some embodiments, by including NMOS transistor m5 in the first path of level shifter circuit 710, and by including NMOS transistor m6 in the second path of level shifter circuit 710, short circuit currents in the first path and the second path of level shifter circuit 710 are prevented when level shifter circuit 710 is disabled by the enable signal EN resulting in lower power consumption than other approaches. In some embodiments, by using a different output circuit 540 in circuit 700, circuit 700 includes less circuit elements than other approaches resulting in less lower power consumption than other approaches. In some embodiments, by using circuit 700, level shifter circuit 510, feedback circuit 720 and feedback circuit 730 are configured to latch the output data signal OUT, and therefore circuit 700 includes less circuit elements than other approaches resulting in less lower power consumption and less area than other approaches. In some embodiments, by using circuit 700, level shifter circuit 610, feedback circuit 720 and feedback circuit 730 are configured to generate feedback signal FS1 and feedback signal FS2, and therefore circuit 700 includes less circuit elements than other approaches resulting in less lower power consumption and less area than other approaches.

In some embodiments, by not including at least NMOS transistor m13 or m14, control of feedback circuit 720 or 730 is simplified. In some embodiments, by not including at least NMOS transistor m13 or m14, less connections between enable circuit 204 and transistor m13 or m14 within corresponding feedback circuit 720 or 730 are utilized, and therefore the complexity of signal routing in circuit 700 is reduced, and therefore circuit 700 includes less circuit elements than other approaches resulting in less lower power consumption and less area than other approaches.

Figure 8:
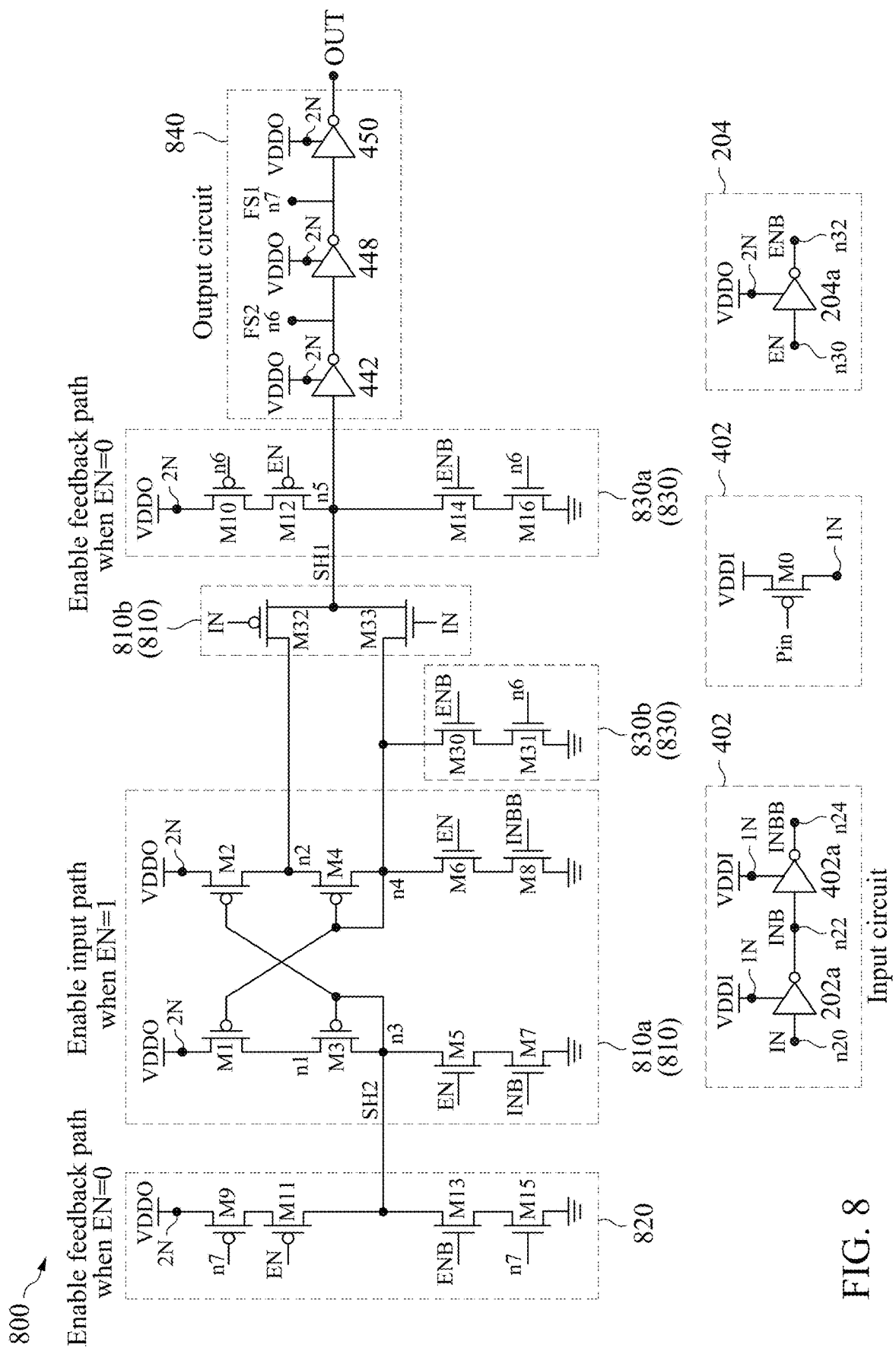
FIG. 8 is a circuit diagram of a circuit, in accordance with some embodiments.

FIG. 8 is a circuit diagram of a circuit 800, in accordance with some embodiments. Circuit 800 is an embodiment of integrated circuit 100A of FIG. 1A and similar detailed description is therefore omitted.

Circuit 800 is a variation of circuit 400 of FIG. 4, and similar detailed description is therefore omitted. In comparison with circuit 400 of FIG. 4, level shifter circuit 810 replaces level shifter circuit 410, and level shifter circuit 810 has a wider range of operating voltages than level shifter circuit 410.

In comparison with circuit 400 of FIG. 4, level shifter circuit 810 replaces level shifter circuit 410, feedback circuit 820 replaces feedback circuit 420, feedback circuit 830 replaces feedback circuit 430, output circuit 840 replaces output circuit 440, and similar detailed description is therefore omitted.

In comparison with output circuit 440 of FIG. 4, nodes n6 and n7 of output circuit 840 replace corresponding nodes n5 and n6, and similar detailed description is therefore omitted. Feedback signal FS2 of circuit 800 corresponds to the signal at node n6, and feedback signal FS1 of circuit 800 corresponds to the signal at node n7.

In comparison with level shifter circuit 410 of FIG. 4, level shifter circuit 810 includes a level shifter circuit 810a and a level shifter circuit 810b. Node n5 of level shifter circuit 810b corresponds to the output node of level shifter 810.

Level shifter circuit 810a is a variation of level shifter circuit 410 of FIG. 4, and similar detailed description is therefore omitted. In comparison with level shifter circuit 410 of FIG. 4, PMOS transistor m3 of level shifter circuit 810a is in a diode-coupled configuration, and PMOS transistor m4 of level shifter circuit 810a is in a diode-coupled configuration. Thus, the gate terminal of PMOS transistor m3 of level shifter circuit 810a is coupled to at least the drain terminal of PMOS transistor m3 at first node n3. Similarly, the gate terminal of PMOS transistor m4 of level shifter circuit 810a is coupled to at least the drain terminal of PMOS transistor m4 at second node n4.

In level shifter circuit 810a, each of the gate terminal of PMOS transistor m3, the drain terminal of PMOS transistor m3, the gate terminal of PMOS transistor m2, the drain terminal of PMOS transistor m11, the drain terminal of NMOS transistor m13, the drain terminal of NMOS transistor m5 and the first node n3 are coupled to each other.

Level shifter circuit 810b is coupled between the second node n4, node n2 and node n5. Level shifter circuit 810b is configured to receive input signal IN. Level shifter circuit 810b is configured to output the voltage of second node n4 or the voltage of node n2 to node n5. Level shifter circuit 810b is configured to output or pass the voltage of second node n4 or the voltage of node n2 to the output circuit 840 in response to input signal IN.

Level shifter circuit 810b comprises an NMOS transistor m33 and a PMOS transistor m32.

A gate terminal of PMOS transistor m32 is coupled to at least node n20 and configured to receive input signal IN. PMOS transistor m32 is turned on or off based on input signal IN. Each of a source terminal of PMOS transistor m32, the drain terminal of PMOS transistor m2, the source terminal of PMOS transistor m4 and node n2 are coupled to each other. The source terminal of PMOS transistor m32 is configured to receive the voltage of node n2. In some embodiments, the voltage of node n2 is equal to the supply reference voltage VSS, the supply voltage VDDO or a voltage equal to supply reference voltage VSS+Vth of PMOS transistor m4, where Vth is the threshold voltage of PMOS transistor m4.

A gate terminal of NMOS transistor m33 is coupled to at least node n20 and configured to receive input signal IN. NMOS transistor m33 is turned on or off based on input signal IN. A source terminal of NMOS transistor m33 is coupled with at least the second node n4. A drain terminal of NMOS transistor m33, and a drain terminal of PMOS transistor m32 are at least coupled to each other. The source terminal of NMOS transistor m33 is configured to receive the voltage of second node n4. In some embodiments, the voltage of second node n4 is equal to the supply reference voltage VSS, the supply voltage VDDO or a voltage equal to supply voltage VDDO-Vth of PMOS transistor m4, where Vth is the threshold voltage of PMOS transistor m4.

Each of the source terminal of NMOS transistor m33, a drain terminal of NMOS transistor m30 (part of feedback circuit 830b described below), the gate terminal of PMOS transistor m4, the drain terminal of PMOS transistor m4, the gate terminal of PMOS transistor m1, and the second node n4 are coupled to each other.

Each of the drain terminal of NMOS transistor m33, the drain terminal of PMOS transistor m32, the drain terminal of NMOS transistor m14, the drain terminal of PMOS transistor m12, the input terminal of inverter 442 and the node n5 are coupled to each other.

PMOS transistor m32 and NMOS transistor m33 are configured to operate in a complementary manner. For example, in some embodiments, if PMOS transistor m32 is enabled or turned on, then NMOS transistor m33 is disabled or turned off, and vice versa. NMOS transistor m33 or PMOS transistor m32 is configured to pass at least the voltage of second node n4 or the voltage of node n2 to node n5 as the first signal SH1.

In comparison with feedback circuit 420 of FIG. 4, the gate terminal of PMOS transistor m9 of feedback circuit 820 and the gate terminal of NMOS transistor m15 of feedback circuit 820 are coupled to at least node n7. Feedback signal FS1 corresponds to the signal at node n7.

Node n7 of output circuit 840 is coupled to at least the output terminal of inverter 448, the input terminal of inverter 450, the gate terminal of PMOS transistor m9 or the gate terminal of NMOS transistor m15. Inverter 448 of output circuit 840 is configured to generate feedback signal FS1 in response to feedback signal FS2 or output signal OUT. Thus, inverter 448 is configured to control feedback circuit 820 by feedback signal FS1.

In comparison with feedback circuit 430 of FIG. 4, feedback circuit 830 includes a feedback circuit 830a and a feedback circuit 830b. Feedback circuit 830a is a variation of feedback circuit 430 of FIG. 4, and similar detailed description is therefore omitted.

In comparison with feedback circuit 430 of FIG. 4, the gate terminal of PMOS transistor m10 of feedback circuit 830a and the gate terminal of NMOS transistor m16 of feedback circuit 830a are coupled to node n6. Feedback signal FS2 corresponds to the signal at node n6.

Node n6 of output circuit 840 is coupled to at least the input terminal of inverter 448, the output terminal of inverter 442, the gate terminal of PMOS transistor m10 or the gate terminal of NMOS transistor m16. Inverter 442 of output circuit 840 is configured to generate feedback signal FS2 (or inverted output signal OUTB) in response to first signal SH1. Thus, inverter 442 is configured to control feedback circuit 820 by feedback signal FS2.

Feedback circuit 830b comprises an NMOS transistor m30 and an NMOS transistor m31.

A gate terminal of NMOS transistor m30 is coupled to at least the node n32 and configured to receive inverted enable signal ENB. NMOS transistor m30 is turned on or off based on inverted enable signal ENB. The drain terminal of NMOS transistor m30 is coupled to at least the second node n4.

A drain terminal of NMOS transistor m31 and a source terminal of NMOS transistor m30 are coupled to each other. A gate terminal of NMOS transistor m31 is coupled to at least node n6 of output circuit 840 and configured to receive feedback signal FS2. In some embodiments, each of the gate terminal of NMOS transistor m31, the gate terminal of NMOS transistor m16, node n6 of output circuit 840, the gate terminal of PMOS transistor m10, the output terminal of inverter 442, and the input terminal of inverter 448 are coupled together. NMOS transistor m31 is turned on or off based on feedback signal FS2. A source terminal of NMOS transistor m31 is coupled with at least the reference supply node VSS.

In some embodiments, by including NMOS transistor m5 in the first path of level shifter circuit 810, and by including NMOS transistor m6 in the second path of level shifter circuit 810, short circuit currents in the first path and the second path of level shifter circuit 810 are prevented when level shifter circuit 810 is disabled by the enable signal EN resulting in lower power consumption than other approaches. In some embodiments, by using a different output circuit 840 in circuit 800, circuit 800 includes less circuit elements than other approaches resulting in less lower power consumption than other approaches. In some embodiments, by using circuit 800, level shifter circuit 810, feedback circuit 820 and feedback circuit 830 are configured to latch the output signal OUT, and therefore circuit 800 includes less circuit elements than other approaches resulting in less lower power consumption and less area than other approaches.

In some embodiments, by using at least diode coupled transistors m3 and m4 in level shifter circuit 810a, transistors m32 and m33 in level shifter circuit 810b or feedback circuit 830, circuit 800 has a wider range of operating voltages than other approaches, resulting in lower power consumption and less area than other approaches.

Figure 9:
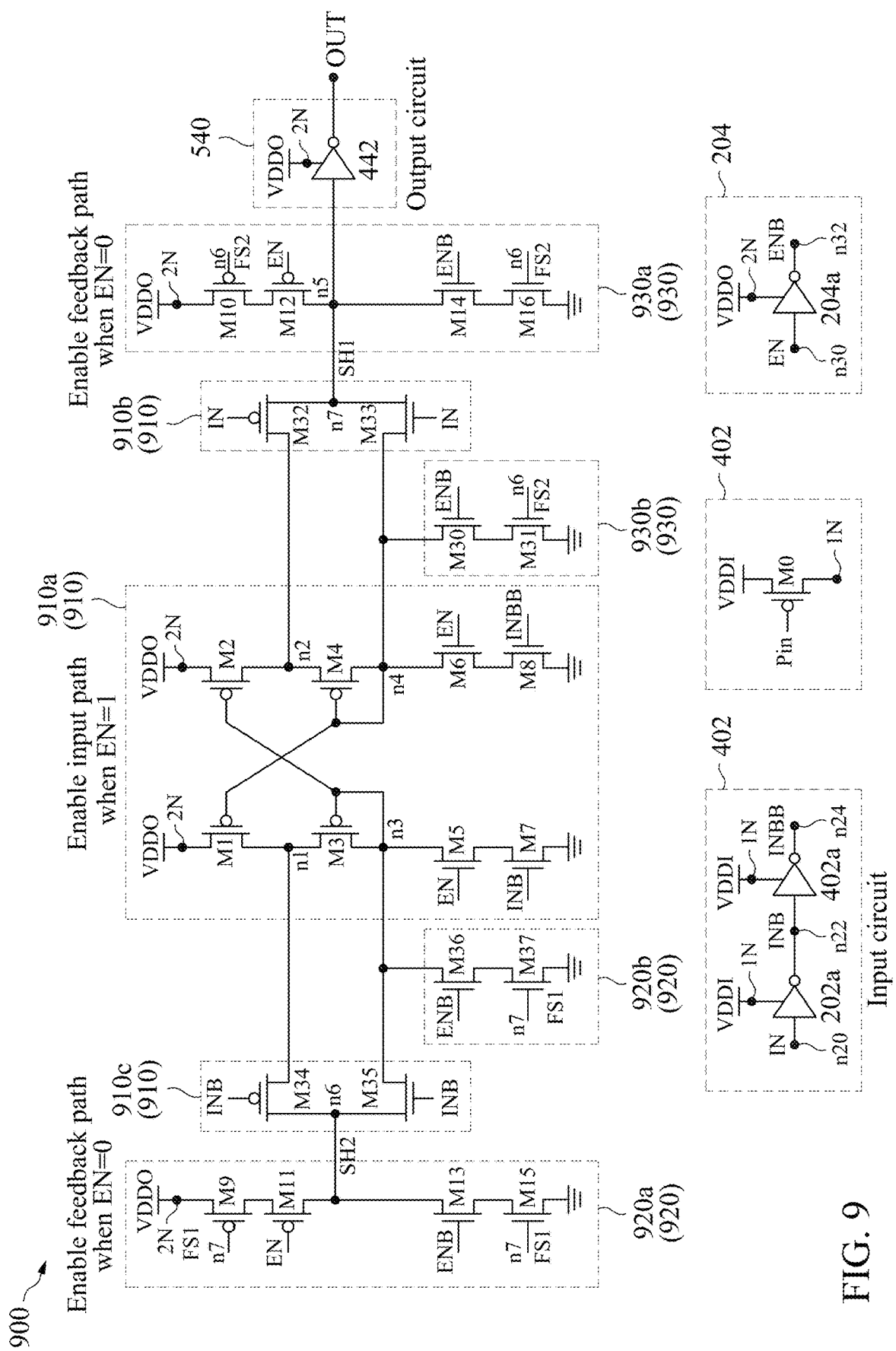
FIG. 9 is a circuit diagram of a circuit, in accordance with some embodiments.

FIG. 9 is a circuit diagram of a circuit 900, in accordance with some embodiments. Circuit 900 is an embodiment of integrated circuit 100B of FIG. 1B and similar detailed description is therefore omitted.

Circuit 900 is a variation of circuit 400 of FIG. 4 or circuit 800 of FIG. 8, and similar detailed description is therefore omitted.

Circuit 900 is a variation of circuit 800 of FIG. 8, and similar detailed description is therefore omitted. In comparison with circuit 800 of FIG. 8, level shifter circuit 910 replaces level shifter circuit 810, and level shifter circuit 910 is configured to generate feedback signals FS1 and FS2. Level shifter circuit 910 is an embodiment of level shifter circuit 110' of FIG. 1B, and similar detailed description is therefore omitted.

In comparison with circuit 500 of FIG. 5, level shifter circuit 910 of FIG. 9 replaces level shifter circuit 510, and therefore level shifter circuit 910 has a wider range of operating voltages than level shifter circuit 510.

In comparison with circuit 800 of FIG. 8, level shifter circuit 910 replaces level shifter circuit 810, feedback circuit 920 replaces feedback circuit 820, feedback circuit 930 replaces feedback circuit 830, output circuit 540 replaces output circuit 440, and similar detailed description is therefore omitted. Level shifter circuit 910 is an embodiment of level shifter circuit 110' of FIG. 1B, and similar detailed description is therefore omitted.

In comparison with output circuit 840 of FIG. 8, output circuit 540 of circuit 900 does not generate feedback signals FS1 and FS2. Level shifter circuit 910 is configured to generate feedback signals FS1 and FS2.

In comparison with level shifter circuit 810 of FIG. 8, level shifter circuit 910 includes a level shifter circuit 910a, a level shifter circuit 910b and a level shifter circuit 910c.

In comparison with level shifter circuit 810 of FIG. 8, an output node (e.g., node n7) of level shifter circuit 910 is coupled to at least feedback circuit 920, and an output node (e.g., node n6) of level shifter circuit 910 is coupled to at least feedback circuit 930.

Feedback signal FS1 corresponds to the voltage of output node (e.g., node n7) of level shifter circuit 910. Level shifter circuits 910a and 910b are configured to output feedback signal FS1 to at least feedback circuit 920.

Feedback signal FS2 corresponds to the voltage of output node (e.g., node n6) of level shifter circuit 910. Level shifter circuits 910a and 910c are configured to output feedback signal FS2 to at least feedback circuit 930.

Level shifter circuit 910a is a variation of level shifter circuit 810a of FIG. 8, and similar detailed description is therefore omitted. Level shifter circuit 910a is coupled to node n7 by level shifter circuit 910b, and coupled to node n6 by level shifter 910c.

In comparison with level shifter circuit 810a of FIG. 8, each of the gate terminal of PMOS transistor m3, the drain terminal of PMOS transistor m3, the gate terminal of PMOS transistor m2, the drain terminal of NMOS transistor m5, a drain terminal of NMOS transistor m36 (part of feedback circuit 920b described below), a source terminal of NMOS transistor m35 (part of level shifter circuit 910c described below) and the first node n3 are coupled to each other.

In comparison with level shifter circuit 810a of FIG. 8, each of the source terminal of PMOS transistor m3, the drain terminal of PMOS transistor m1, a source terminal of PMOS transistor m34 (part of level shifter circuit 910c described below), and node n1 are coupled to each other.

Level shifter circuit 910b is a variation of level shifter circuit 810b of FIG. 8, and similar detailed description is therefore omitted.

In comparison with level shifter circuit 810b of FIG. 8, node n7 of level shifter circuit 910b corresponds to the output node of level shifter circuit 910. Node n7 of level shifter circuit 910 couples the drain terminal of NMOS transistor m33 and the drain terminal of PMOS transistor m32 to each other. Node n7 of level shifter circuit 910b corresponds to node n5, and vice versa. Feedback signal FS1 corresponds to the voltage of output node (e.g., node n7) of level shifter circuit 910. Level shifter circuit 910b is configured to output feedback signal FS1.

In comparison with level shifter circuit 810b and feedback circuit 820 of FIG. 8, each of the drain terminal of NMOS transistor m33, the drain terminal of PMOS transistor m32, the gate terminal of PMOS transistor m9 of feedback circuit 920a (described below), the gate terminal of NMOS transistor m15 of feedback circuit 920a (described below), a gate terminal m37 of NMOS transistor of feedback circuit 920b (described below), the drain of NMOS transistor m14, the drain of PMOS transistor m12, the input terminal of inverter 442 and node n7 (or node n5) are coupled to each other.

Level shifter circuits 910a and 910c are configured to output feedback signal FS2 to at least feedback circuit 930. Feedback signal FS2 corresponds to the voltage of another output node (e.g., node n6) of level shifter circuit 910.

Level shifter circuit 910c is coupled between the first node n3, node n1 and node n6. Level shifter circuit 910c is configured to receive input signal INB. Level shifter circuit 910c is configured to output the voltage of first node n3 or the voltage of node n1 to node n6 as feedback signal FS2. Level shifter circuit 910c is configured to output or pass the voltage of first node n3 or the voltage of node n1 to the output circuit 840 as feedback signal FS2 in response to input signal INB. Level shifter circuit 910c comprises an NMOS transistor m35 and a PMOS transistor m34.

A gate terminal of PMOS transistor m34 is coupled to at least node n22 and configured to receive input signal INB. PMOS transistor m34 is turned on or off based on input signal INB. Each of a source terminal of PMOS transistor m34, the drain terminal of PMOS transistor m1, the source terminal of PMOS transistor m3 and node n1 are coupled to each other. The source terminal of PMOS transistor m34 is configured to receive the voltage of node n1. In some embodiments, the voltage of node n1 is equal to the supply reference voltage VSS, the supply voltage VDDO or a voltage equal to supply reference voltage VSS+Vth of PMOS transistor m3, where Vth is the threshold voltage of PMOS transistor m3.

A gate terminal of NMOS transistor m35 is coupled to at least node n20 and configured to receive input signal INB. NMOS transistor m35 is turned on or off based on input signal INB. A source terminal of NMOS transistor m35 is coupled with at least the first node n3. The source terminal of NMOS transistor m35 is configured to receive the voltage of first node n3. In some embodiments, the voltage of first node n3 is equal to the supply reference voltage VSS, the supply voltage VDDO or a voltage equal to supply voltage VDDO−Vth of PMOS transistor m3, where Vth is the threshold voltage of PMOS transistor m3.

Node n6 of level shifter circuit 910c corresponds to another output node of level shifter circuit 910. Node n6 of level shifter circuit 910 couples a drain terminal of NMOS transistor m35 and a drain terminal of PMOS transistor m34 to each other.

Each of the drain terminal of NMOS transistor m35, the drain terminal of PMOS transistor m34, the gate terminal of PMOS transistor m11 of feedback circuit 920a, the gate terminal of NMOS transistor m15 of feedback circuit 920a, a gate terminal m37 of NMOS transistor of feedback circuit 920b (described below) and node n6 are coupled to each other.

PMOS transistor m34 and NMOS transistor m35 are configured to operate in a complementary manner. For example, in some embodiments, if PMOS transistor m34 is enabled or turned on, then NMOS transistor m35 is disabled or turned off, and vice versa. NMOS transistor m35 or PMOS transistor m34 is configured to pass at least the voltage of first node n3 or the voltage of node n1 to node n6 as the feedback signal FS2.

In comparison with circuit 800 of FIG. 8, feedback circuit 930a replaces feedback circuit 830a, and feedback circuit 930b replaces feedback circuit 830b, and similar detailed description is therefore omitted.

In comparison with feedback circuits 830a and 830b of FIG. 8, feedback signal FS2 at node n6 is generated by at least level shifter circuit 910a or 910c, and not output circuit 840.

Each of feedback circuits 930a and 930b are configured to receive feedback signal FS2. Feedback circuits 930a and 930b are controlled by at least level shifter circuit 910a or 910c via feedback signal FS2.

Each of the gate terminal of PMOS transistor m10 of feedback circuit 930a, the gate terminal of NMOS transistor m16 of feedback circuit 930a and the gate terminal of NMOS transistor m31 of feedback circuit 930b are configured to receive feedback signal FS2 from level shifter circuit 910c.

In comparison with feedback circuit 820 of FIG. 8, the gate terminal of PMOS transistor m9 of feedback circuit 930 and the gate terminal of NMOS transistor m15 of feedback circuit 930 are coupled to at least node n7. Feedback signal FS1 corresponds to the signal at node n7.

In comparison with feedback circuit 820 of FIG. 8, feedback circuit 920 includes a feedback circuit 920a and a feedback circuit 920b. Feedback circuit 920a is a variation of feedback circuit 820 of FIG. 8, and similar detailed description is therefore omitted.

In comparison with feedback circuit 820 of FIG. 8, feedback signal FS1 at node n7 is generated by at least level shifter circuit 910a or 910b, and not output circuit 840.

Each of feedback circuits 920a and 920b are configured to receive feedback signal FS1. Feedback circuits 920a and 920b are controlled by at least level shifter circuit 910a or 910b via feedback signal FS1.

Each of the gate terminal of PMOS transistor m9 of feedback circuit 920a, the gate terminal of NMOS transistor m15 of feedback circuit 920a, the gate terminal of NMOS transistor m37 of feedback circuit 920b and the input terminal of inverter 442 of output circuit 540 are configured to receive feedback signal FS1 from level shifter circuit 910b. At least level shifter circuit 910a or 910b is configured to control feedback circuit 920 by feedback signal FS1.

Feedback circuit 920b comprises an NMOS transistor m36 and an NMOS transistor m37.

A gate terminal of NMOS transistor m36 is coupled to at least node n32 and configured to receive inverted enable signal ENB. NMOS transistor m36 is turned on or off based on inverted enable signal ENB. The drain terminal of NMOS transistor m36 is coupled to at least the first node n3.

A drain terminal of NMOS transistor m37 and a source terminal of NMOS transistor m36 are coupled to each other. A gate terminal of NMOS transistor m37 is coupled to at least node n7 of level shifter circuit 910b and configured to receive feedback signal FS2. NMOS transistor m37 is turned on or off based on feedback signal FS2. A source terminal of NMOS transistor m37 is coupled with at least the reference supply node VSS.

In some embodiments, by including NMOS transistor m5 in the first path of level shifter circuit 810, and by including NMOS transistor m6 in the second path of level shifter circuit 810, short circuit currents in the first path and the second path of level shifter circuit 810 are prevented when level shifter circuit 810 is disabled by the enable signal EN resulting in lower power consumption than other approaches. In some embodiments, by using a different output circuit 840 in circuit 800, circuit 800 includes less circuit elements than other approaches resulting in less lower power consumption than other approaches. In some embodiments, by using circuit 800, level shifter circuit 810, feedback circuit 820 and feedback circuit 830 are configured to latch the output signal OUT, and therefore circuit 800 includes less circuit elements than other approaches resulting in less lower power consumption and less area than other approaches.

In some embodiments, by using circuit 900, level shifter circuit 910, feedback circuit 920 and feedback circuit 930 are configured to generate feedback signal FS1 and feedback signal FS2, and therefore circuit 900 includes less circuit elements than other approaches resulting in less lower power consumption and less area than other approaches.

In some embodiments, by using at least diode coupled transistors m3 and m4 in level shifter circuit 910a, transistors m32 and m33 in level shifter circuit 910b, transistors m34 and m35 in level shifter circuit 910c, feedback circuit 920 or feedback circuit 930, circuit 900 has a wider range of operating voltages than other approaches, resulting in lower power consumption and less area than other approaches.

Method

Figure 10A:
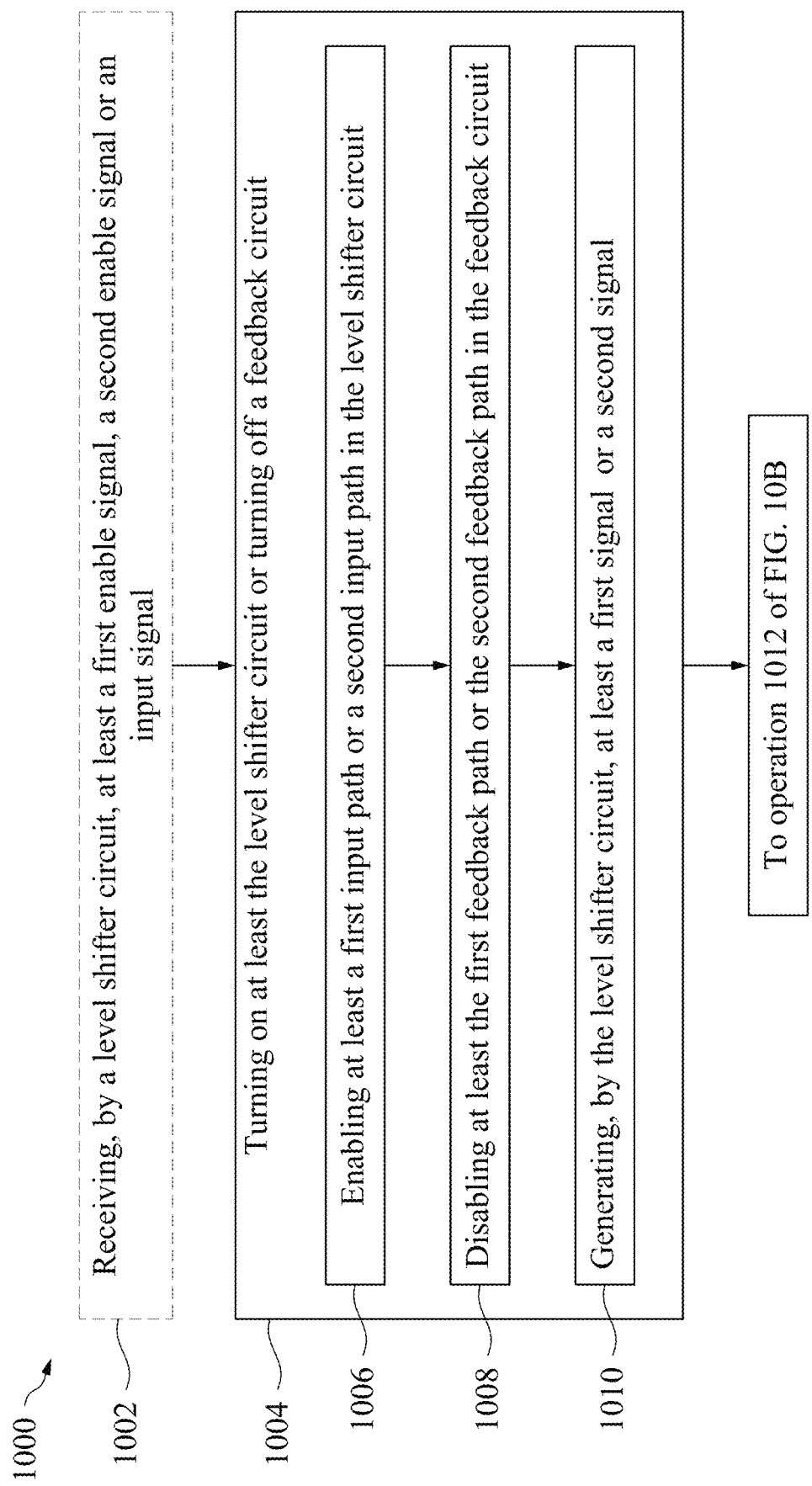
FIGS. 10A-10B are a flowchart of a method of operating a circuit, such as the circuit of FIGS. 1A-1B, FIG. 2, FIG. 3, FIG. 4, FIG. 5, FIG. 6, FIG. 7, FIG. 8 or FIG. 9, in accordance with some embodiments.
Figure 10B:
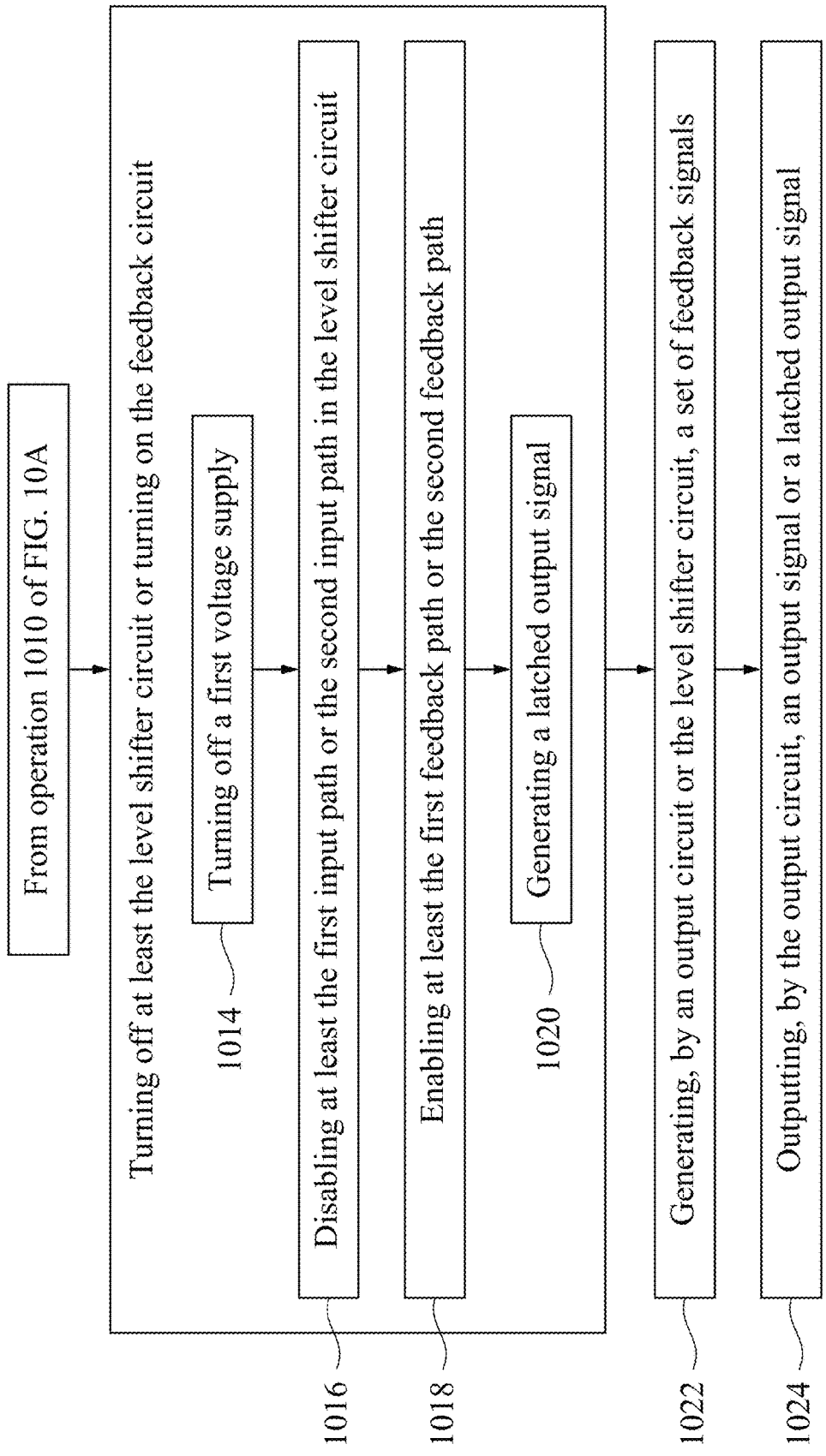

FIGS. 10A-10B are a flowchart of a method of operating a circuit, such as the circuit of FIGS. 1A-1B or FIGS. 2-8, in accordance with some embodiments. It is understood that additional operations may be performed before, during, and/or after the method 1000 depicted in FIG. 10, and that some other processes may only be briefly described herein. It is understood that method 1000 utilizes features of one or more of circuits 100A-100B of FIGS. 1A-1B or circuits 200-800 of corresponding FIGS. 2-8.

In operation 1002 of method 1000, a first enable signal (enable signal EN), a second enable signal (inverted enable signal ENB) or an input signal (IN, INB or INBB) is received by a level shifter circuit 110 or 110'.

In operation 1004 of method 1000, level shifter circuit 110 or 110' is turned on or enabled in response to enable signal EN, or a feedback circuit 220 or 230 is turned off or disabled in response to at least enable signal EN. In some embodiments, level shifter circuit 110 or 110' is turned on or enabled in response to enable signal EN having a first logical value, or feedback circuit 220 or 230 is turned off or disabled in response to enable signal EN having the first logical value. In some embodiments, the first logical value is a logical high. In some embodiments the first logical value is a logical low.

In some embodiments, level shifter circuit 110 or 110' and feedback circuit 220 or 230 are operated in a complementary manner such that turning on one of level shifter circuit 110 or 110' or feedback circuit 220 or 230 turns off the other of the level shifter circuit 110 or 110' or feedback circuit 220 or 230, and vice versa. In some embodiments, turning on or enabling level shifter circuit 110 or 110' comprises turning off or disabling the feedback circuit 220 or 230. In some embodiments, turning off or disabling the feedback circuit 220 or 230 comprises turning on or enabling level shifter circuit 110 or 110'. In some embodiments, operation 1004 comprises one or more of operations 1006, 1008 or 1010. In some embodiments, operations 1006, 1008 and 1010 occur in response to enable signal EN having the first logical value. In some embodiments, operation 1004 of method 1000 further comprises turning on or switching on a first voltage supply (voltage supply VDDI). In some embodiments, the first voltage supply has the first voltage swing. In some embodiments, turning on or switching on the first voltage supply (voltage supply VDDI) comprises turning on a transistor (PMOS transistor m0) responsive to a power enable signal Pin, such that PMOS transistor m0 provides supply voltage VDDI to at least a first voltage supply node 1N, an inverter 202a or inverter 402a.

In operation 1006 of method 1000, at least a first input path or a second input path in level shifter circuit 110 or 110' is enabled in response to at least enable signal EN or inverted enable signal ENB. In some embodiments, the first input path of level shifter circuit 210 includes one or more of NMOS transistor m5, NMOS transistor m7, PMOS transistor m1 or PMOS transistor m3. In some embodiments the second input path of level shifter 210 includes one or more of NMOS transistor m6, NMOS transistor M8, PMOS transistor m2 or PMOS transistor m4 are referred to as a second input path of level shifter circuit 210.

In operation 1008 of method 1000, at least a first feedback path or a second feedback path in feedback circuit 220 or 230 is disabled in response to at least the first enable signal EN (enable signal EN), the second enable signal (inverted enable signal ENB) or the set of feedback signals FS. In some embodiments, the first feedback path of feedback circuit 220 includes one or more of NMOS transistor m13, NMOS transistor m15, PMOS transistor m9 or PMOS transistor m11. In some embodiments, the second feedback path of feedback circuit 230 includes one or more of NMOS transistor m14, NMOS transistor m16, PMOS transistor m10 or PMOS transistor m12.

In operation 1010 of method 1000, level shifter circuit 110 or 110' generates at least a first signal SH1 or a second signal SH2 in response to at least the first enable signal (enable signal EN) and an input signal IN, INB or INBB. In some embodiments, input signal IN, INB or INBB has the first voltage swing. In some embodiments, the first signal SH1 or the second signal SH2 has the second voltage swing different from the first voltage swing. In some embodiments, the first signal SH1 is inverted from input signal IN or INBB. In some embodiments, the second signal SH2 is inverted from input signal INB.

In operation 1012 of method 1000, level shifter circuit 110 or 110' is turned off or disabled in response to the first enable signal (enable signal EN), or feedback circuit 220 or 230 is turned on or enabled in response to at least the first enable signal (enable signal EN).

In some embodiments, level shifter circuit 110 or 110' is turned off or disabled in response to enable signal EN having the second logical value, or feedback circuit 220 or 230 is turned on or enabled in response to enable signal EN having the second logical value. The second logical value is inverted from the first logical value. In some embodiments, the second logical value is a logical low. In some embodiments the second logical value is a logical high. In some embodiments, turning off or disabling level shifter circuit 110 or 110' comprises turning on or enabling the feedback circuit 220 or 230. In some embodiments, turning on or enabling the feedback circuit 220 or 230 comprises turning off or disabling level shifter circuit 110 or 110'. In some embodiments, operation 1012 comprises one or more of operations 1014, 1016, 1018 or 1020. In some embodiments, operations 1014, 1016, 1018 and 1020 occur in response to enable signal EN having the second logical value and inverted enable signal having the first logical value.

In operation 1014 of method 1000, a first voltage supply (voltage supply VDDI) is turned off or switched off. In some embodiments, the first voltage supply has the first voltage swing. In some embodiments, operation 1014 comprises turning off a transistor (PMOS transistor m0) responsive to a power enable signal Pin, such that PMOS transistor m0 does not provide supply voltage VDDI to at least a first voltage supply node 1N, an inverter 202a or inverter 402a.

In operation 1016 of method 1000, at least a first input path or a second input path in level shifter circuit 110 or 110' is disabled in response to at least enable signal EN or inverted enable signal ENB.

In operation 1018 of method 1000, at least a first feedback path or a second feedback path in feedback circuit 220 or 230 is enabled in response to at least the first enable signal EN (enable signal EN), the second enable signal (inverted enable signal ENB) or the set of feedback signals FS.

In operation 1020 of method 1000, a latched output signal (e.g., OUT) is generated. In some embodiments, operation 1020 includes at least operation 1020a or 1020b. In some embodiments, operations 1020, 1020a and 1020b occur in response to enable signal EN having the second logical value and inverted enable signal having the first logical value.

In operation 1020a of method 1000, an output circuit 140 of FIG. 1A is configured to latch a previous state of an output signal OUT. In some embodiments, the latched output signal of operation 1020 corresponds to the previous state of the output signal OUT. In some embodiments, operation 1020a is performed by inverter 242, inverter 246 and transmission gate 252 of output circuit 240.

In operation 1020b of method 1000, feedback circuit 120' and 130' of FIG. 1B are configured to latch the first signal SH1 or the second signal SH2. In some embodiments, the latched output signal of operation 1020 corresponds to the first signal SH1 or the second signal SH2. In some embodiments, operation 1020b is performed by feedback circuit 520 and feedback circuit 530.

In some embodiments, a portion of operation 1020a and a portion of operation 1020b are combined such that portions of output circuit 440 or 840 and feedback circuit 420, 430, 820 or 830 are together configured to latch the output signal OUT (second signal SH2) or inverted output signal OUTB (first signal SH1).

In operation 1022 of method 1000, the set of feedback signals FS are generated by output circuit 140 or level shifter circuit 110'. In some embodiments, operation 1022 includes generating the set of feedback signals FS by output circuit 140 or level shifter circuit 110'. In some embodiments, operation 1022 includes at least operation 1022a or 1022b.

In some embodiments, operation 1022a comprises the output circuit 140, 240, 340, 440 or 840 being configured to generate the set of feedback signals FS. In some embodiments, the set of feedback signals FS includes at least the output signal (OUT) or an inverted output signal (OUTB).

In some embodiments, operation 1022a is performed in combination with operation 1020a. For example, in some embodiments, output circuit 240 is configured to latch the output signal OUT and also generate the set of feedback signals FS.

In some embodiments, operation 1022b comprises the level shifter circuit 110', 510, 610 or 910 being configured to generate the set of feedback signals FS.

In some embodiments, operation 1022b is performed in combination with operation 1020b. For example, in some embodiments, at least feedback circuit 520, 530, 620, 630, 720, 730, 920 or 930 being configured to latch the output signal OUT, and level shifter circuits 110', 510, 610 or 910 configured to generate the set of feedback signals FS.

In some embodiments, operation 1022b is performed in combination with operation 1020a. For example, in some embodiments, at least feedback circuit 520, 530, 620, 630, 720, 730, 920 or 930 being configured to latch the first signal SH1 or second signal SH2, and level shifter circuits 110', 510, 610 or 910 configured to generate the set of feedback signals FS.

In operation 1024 of method 1000, the output circuit 140 or 140' is configured to output the output signal OUT in response to at least the enable signal EN or the first signal SH1.

In some embodiments, the output signal OUT corresponds to the latched output signal of a previous state of the output signal OUT or an inverted version of the first signal SH1 of circuit 200. In some embodiments, the inverted version of first signal SH1 (e.g., second signal SH2) corresponds to a level shifted version of input signal IN. In some embodiments, operation 1024 occurs in response to enable signal EN having the second logical value and inverted enable signal having the first logical value.

In some embodiments, the output signal OUT corresponds to the latched output signal of a previous state of the output signal OUT in response to enable signal EN having the second logical value. In some embodiments, the output signal OUT corresponds to the level shifted version of the input signal IN (e.g., inverted version of first signal SH1) in response to enable signal EN having the first logical value.

In some embodiments, one or more of the operations of method 1000 is not performed. While method 1000 was described above with reference to FIGS. 1A-1B & 2, it is understood that method 1000 utilizes the features of one or more of FIGS. 3-9. In some these embodiments, other operations of method 1000 would be performed consistent with the description and operation of circuits 300-900 of FIGS. 3-9. Furthermore, various PMOS or NMOS transistors shown in FIGS. 2-9 are of a particular dopant type (e.g., N-type or P-type) are for illustration purposes. Embodiments of the disclosure are not limited to a particular transistor type, and one or more of the PMOS or NMOS transistors shown in FIGS. 2-9 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters in input circuit 202 or 402 is within the scope of various embodiments. Selecting different numbers of inverters in enable circuit 204 is within the scope of various embodiments. Selecting different numbers of inverters in output circuit 240, 340, 440, 540 or 840 is within the scope of various embodiments. Selecting different numbers of transmission gates in output circuit 240 or 340 is within the scope of various embodiments. Selecting different numbers of transistors in circuit 200, 300, 400, 500, 600, 700, 800 or 900 is within the scope of various embodiments.

One aspect of this description relates to a circuit. In some embodiments, the circuit includes a level shifter circuit, an output circuit, an enable circuit, a first and a second feedback circuit. In some embodiments, the level shifter circuit is coupled to a first voltage supply, and configured to receive at least a first enable signal, a first input signal or a second input signal, and to generate at least a first signal and a second signal responsive to at least the first enable signal or the first input signal. In some embodiments, the output circuit is coupled to at least the level shifter circuit and the first voltage supply, and configured to receive the first signal and the second signal, and to generate at least an output signal, a first feedback signal or a second feedback signal responsive to the first signal. In some embodiments, the enable circuit is configured to generate a second enable signal in response to the first enable signal. In some embodiments, the first feedback circuit is coupled to the level shifter circuit, the enable circuit, the output circuit and the first voltage supply, and configured to receive the first enable signal, the second enable signal and the first feedback signal. In some embodiments, the second feedback circuit is coupled to the level shifter circuit, the enable circuit, the output circuit and the first voltage supply, and configured to receive the first enable signal, the second enable signal and the second feedback signal.

Another aspect of this description relates to a circuit. In some embodiments, the circuit includes an input circuit, a level shifter circuit, an enable circuit, a first and a second feedback circuit and an output circuit. In some embodiments, the input circuit is coupled to a first voltage supply, and configured to generate a first input signal in response to a second input signal. In some embodiments, the level shifter circuit configured to receive a first enable signal and the first input signal having a first voltage swing, and to generate a first signal and a second signal responsive to at least the first enable signal or the first input signal, the first signal or the second signal having a second voltage swing different from the first voltage swing. In some embodiments, the enable circuit configured to generate a second enable signal in responsive to the first enable signal. In some embodiments, the first feedback circuit coupled to the level shifter circuit and the enable circuit, and configured to latch a previous state of the first signal responsive to the second signal. In some embodiments, the second feedback circuit coupled to the level shifter circuit and the enable circuit, and configured to latch a previous state of the second signal responsive to the first signal. In some embodiments, the output circuit coupled to the level shifter circuit, the first feedback circuit and the second feedback circuit, and configured to generate an output signal based on at least the first signal.

Yet another aspect of this description relates to a method of operating a circuit. The method includes enabling a level shifter circuit in response to a first enable signal, and generating, by an output circuit or the level shifter circuit, the set of feedback signals. In some embodiments, enabling the level shifter circuit includes disabling a first feedback path in a feedback circuit responsive to the first enable signal, a second enable signal and a set of feedback signals, the second enable signal being inverted from the first enable signal; enabling at least a first input path or a second input path in the level shifter circuit responsive to at least the first enable signal; and generating at least a first signal or a second signal.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a level shifter circuit coupled to a first voltage supply, and configured to receive at least a first enable signal, a first input signal or a second input signal, and to generate at least a first signal and a second signal responsive to at least the first enable signal or the first input signal;
   an output circuit coupled to at least the level shifter circuit and the first voltage supply, and configured to receive the first signal and the second signal, and to generate at least an output signal, a first feedback signal or a second feedback signal responsive to the first signal;
   an enable circuit configured to generate a second enable signal responsive to the first enable signal;
   a first feedback circuit coupled to the level shifter circuit, the enable circuit, the output circuit and the first voltage supply, and configured to receive the first enable signal, the second enable signal and the first feedback signal; and
   a second feedback circuit coupled to the level shifter circuit, the enable circuit, the output circuit and the first voltage supply, and configured to receive the first enable signal, the second enable signal and the second feedback signal.

2. The circuit of claim 1, wherein the enable circuit comprises:
   an inverter coupled to the first voltage supply, and being configured to generate the second enable signal responsive to the first enable signal, the second enable signal being inverted from the first enable signal.

3. The circuit of claim 1, wherein the first feedback circuit comprises:
   a first set of transistors configured to receive the first enable signal, the second enable signal and the first feedback signal, and being coupled to the enable circuit, the first voltage supply, a reference voltage supply and a first node of the level shifter circuit.

4. The circuit of claim 3, wherein the first set of transistors comprises:
   a first p-type transistor having a first terminal coupled to a first output node of the output circuit, and configured to receive the first feedback signal, and a second terminal of the first p-type transistor is coupled to the first voltage supply;
   a second p-type transistor having a first terminal configured to receive the first enable signal, a second terminal of the second p-type transistor is coupled to a third terminal of the first p-type transistor, and a third terminal of the second p-type transistor is coupled to at least the first node of the level shifter circuit;
   a first n-type transistor having a first terminal configured to receive the second enable signal, and a second terminal of the first n-type transistor is coupled to the third terminal of the second p-type transistor and the first node of the level shifter circuit; and
   a second n-type transistor having a first terminal coupled to the first output node of the output circuit, and configured to receive the first feedback signal, a second terminal of the second n-type transistor is coupled to a third terminal of the first n-type transistor, and a third terminal of the second n-type transistor is coupled to the reference voltage supply.

5. The circuit of claim 3, wherein the second feedback circuit comprises:
   a second set of transistors configured to receive the first enable signal, the second enable signal and the second feedback signal, and being coupled to the enable circuit, the first voltage supply, the reference voltage supply and a second node of the level shifter circuit, the second feedback signal being inverted from the first feedback signal.

6. The circuit of claim 5, wherein the second set of transistors comprises:
   a first p-type transistor having a first terminal coupled to a first output node of the output circuit, and configured to receive the second feedback signal, and a second terminal of the first p-type transistor is coupled to the first voltage supply;
   a second p-type transistor having a first terminal configured to receive the first enable signal, a second terminal of the second p-type transistor is coupled to a third terminal of the first p-type transistor, and a third terminal of the second p-type transistor is coupled to at least the second node of the level shifter circuit;
   a first n-type transistor having a first terminal configured to receive the second enable signal, and a second terminal of the first n-type transistor is coupled to the third terminal of the second p-type transistor and the second node of the level shifter circuit; and
   a second n-type transistor having a first terminal coupled to the first output node of the output circuit, and configured to receive the second feedback signal, a second terminal of the second n-type transistor is coupled to a third terminal of the first n-type transistor, and a third terminal of the second n-type transistor is coupled to the reference voltage supply.

7. The circuit of claim 1, wherein the level shifter circuit comprises:
   a first set of transistors coupled between a first node and the first voltage supply;
   a second set of transistors coupled between a second node and the first voltage supply, a voltage of the first node or the second node corresponds to a voltage of the first signal;
   a first transistor coupled to a reference supply node, and being configured to receive the second input signal;

a second transistor coupled to the reference supply node, and being configured to receive the first input signal;

a third transistor coupled between the first node and the first transistor, and being configured to receive the first enable signal; and a fourth transistor coupled between the second node and the second transistor, and being configured to receive the first enable signal.

8. The circuit of claim 7, wherein the level shifter circuit further comprises:

a fifth transistor coupled between an input node of the output circuit and either the first node or the second node, and configured to receive the first input signal; and a sixth transistor coupled between the input node of the output circuit and a third node of the level shifter circuit, and configured to receive the first input signal, the third node of the level shifter circuit being between a first transistor of the first set of transistors and a second transistor of the first set of transistors.

9. The circuit of claim 8, wherein the level shifter circuit further comprises:

a seventh transistor coupled to the reference supply node, and being configured to receive the first feedback signal; and an eighth transistor coupled between the seventh transistor and a first terminal of the fifth transistor and either the first node or the second node, and being configured to receive the second enable signal.

10. The circuit of claim 1, further comprising:

an input circuit comprising:

a first inverter coupled to a node of a second voltage supply, the second voltage supply being different from the first voltage supply, and configured to generate the second input signal responsive to the first input signal, the first input signal being inverted from the second input signal.

11. The circuit of claim 10, wherein the input circuit further comprises:

a second inverter coupled to the node of the second voltage supply and the first inverter, and configured to generate a third input signal responsive to the second input signal, the third input signal being inverted from the second input signal.

12. The circuit of claim 11, wherein the input circuit further comprises:

a first transistor coupled between the second voltage supply and the node of the second voltage supply, the first transistor being configured to receive an input power signal, and to set a voltage of the node of the second voltage supply responsive to the input power signal.

13. A circuit comprising:

an input circuit coupled to a first voltage supply, and configured to generate a first input signal responsive to a second input signal;

a level shifter circuit configured to receive a first enable signal and the first input signal having a first voltage swing, and to generate a first signal and a second signal responsive to at least the first enable signal or the first input signal, the first signal or the second signal having a second voltage swing different from the first voltage swing;

an enable circuit configured to generate a second enable signal responsive to the first enable signal;

a first feedback circuit coupled to the level shifter circuit and the enable circuit, and configured to latch a previous state of the first signal responsive to the second signal;

a second feedback circuit coupled to the level shifter circuit and the enable circuit, and configured to latch a previous state of the second signal responsive to the first signal; and an output circuit coupled to the level shifter circuit, the first feedback circuit and the second feedback circuit, and configured to generate an output signal based on at least the first signal.

14. The circuit of claim 13, wherein the enable circuit comprises:

an inverter coupled to a second voltage supply different from the first voltage supply, and being configured to generate the second enable signal responsive to the first enable signal, the second enable signal being inverted from the first enable signal.

15. The circuit of claim 13, wherein the first feedback circuit comprises:

a first set of transistors configured to receive the first enable signal, the second enable signal and the second signal, and being coupled to the enable circuit, a second voltage supply, a reference voltage supply and a first node of the level shifter circuit, the second voltage supply being different from the first voltage supply.

16. The circuit of claim 15, wherein the second feedback circuit comprises:

a second set of transistors configured to receive the first enable signal, the second enable signal and the first signal, and being coupled to the enable circuit, the second voltage supply, the reference voltage supply and a second node of the level shifter circuit.

17. The circuit of claim 13, wherein the output circuit comprises:

an inverter coupled to a second voltage supply different from the first voltage supply, the inverter including a first terminal of the inverter coupled to an output of the level shifter circuit by a first node, and being configured to receive the first signal, and a second terminal of the inverter being configured to generate the output signal responsive to the first signal.

18. The circuit of claim 13, wherein the level shifter circuit comprises:

a first set of transistors coupled between a first node and a second voltage supply different from the first voltage supply;

a second set of transistors coupled between a second node and the second voltage supply, a voltage of the second node corresponds to a voltage of the first signal;

a first transistor coupled to a reference voltage supply, and being configured to receive the second input signal;

a second transistor coupled to the reference voltage supply, and being configured to receive the first input signal;

a third transistor coupled between the first node and the first transistor, and being configured to receive the first enable signal; and a fourth transistor coupled between the second node and the second transistor and being configured to receive the first enable signal.

19. A method of operating a circuit, the method comprising:

enabling a level shifter circuit responsive to a first enable signal, wherein enabling the level shifter circuit comprises:

disabling a first feedback path in a feedback circuit responsive to the first enable signal, a second enable signal and a set of feedback signals, the second enable signal being inverted from the first enable signal;

enabling at least a first input path or a second input path in the level shifter circuit responsive to at least the first enable signal; and generating at least a first signal or a second signal; and generating, by an output circuit or the level shifter circuit, the set of feedback signals.

20. The method of claim 19, wherein the enabling the level shifter circuit further comprises:

disabling a second feedback path in the feedback circuit responsive to the first enable signal, the second enable signal and the set of feedback signals; and the generating at least the first signal or the second signal comprises:

generating at least the first signal or the second signal responsive to the first enable signal, a first input signal and a second input signal, the first input signal and the second input signal having a first voltage swing, the first signal or the second signal having a second voltage swing different from the first voltage swing, and the first input signal being inverted from the second input signal.

* * * * *